United States Patent
Seo et al.

(10) Patent No.: US 7,196,360 B2
(45) Date of Patent: Mar. 27, 2007

(54) LIGHT EMITTING DEVICE

(75) Inventors: Satoshi Seo, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 84 days.

(21) Appl. No.: 10/072,507

(22) Filed: Feb. 5, 2002

(65) Prior Publication Data

US 2002/0105005 A1 Aug. 8, 2002

(30) Foreign Application Priority Data

Feb. 8, 2001 (JP) ........................ 2001-032995

(51) Int. Cl.
*H01L 29/24* (2006.01)
*H01L 35/24* (2006.01)

(52) U.S. Cl. .................. 257/101; 257/103; 257/40

(58) Field of Classification Search ............ 257/101, 257/72, 40, 103; 428/690
See application file for complete search history.

(56) References Cited

U.S. PATENT DOCUMENTS

| | | | |
|---|---|---|---|
| 3,654,525 A | 4/1972 | Maricle et al. | |
| 5,017,863 A | 5/1991 | Mellitz | |
| 5,039,657 A | 8/1991 | Goldman et al. | |

(Continued)

FOREIGN PATENT DOCUMENTS

| | | |
|---|---|---|
| CH | 366598 | 8/1999 |
| EP | 1 011 155 A2 | 6/2000 |
| EP | 1 065 737 | 1/2001 |

(Continued)

OTHER PUBLICATIONS

J. Kido et al. "Multilayer white light–emitting organic electroluminescent device." Science 267: 1995. p. 1332–1334.

Takeshi Nishi et al.; "High Efficiency TFT–OLED Display with Iridium–Complex As Triplet Emissive Center"; *Proceedings of the 10th International Workshop on Inorganic and Organic Electroluminescence*, pp. 353–356, Dec. 4–7, 2000.

Invitation to Respond to Written Opinion w/International Search Report, 6 pages, Jun. 10, 2004.

Tsutsui, "New Aspect of Research and Development of Organic EL", *Bulletin of organic molecular/bioelectronics*, Subcommittee of Society of Applied Physics, vol. 11, No. 1, p. 8, 2000 (including partial translation).

(Continued)

*Primary Examiner*—Zandra V. Smith
*Assistant Examiner*—Kiesha Rose
(74) *Attorney, Agent, or Firm*—Fish & Richardson P.C.

(57) ABSTRACT

A light emitting device and electronic equipment having a long life at a low electric power consumption are provided. A hole transporting region composed of a hole transporting material, an electron transporting region composed of an electron transporting material, and a mixture region in which both the hole transporting material and the electron transporting material are mixed at a fixed ratio are formed within an organic compound film. Regions having a concentration gradient are formed between the mixture region and carrier transporting regions until the fixed ratio is achieved. In addition, by doping a light emitting material into the mixture region, functions of hole transportation, electron transportation, and light emission can be respectively expressed while all of the interfaces existing between layers of a conventional lamination structure are removed. Organic light emitting elements having low electric power consumption and a long life can thus be provided, and light emitting devices and electronic equipment can be manufactured using the organic light emitting elements.

31 Claims, 21 Drawing Sheets

U.S. PATENT DOCUMENTS

| | | |
|---|---|---|
| 5,170,990 A | 12/1992 | Kamiya et al. |
| 5,256,945 A | 10/1993 | Imai et al. |
| 5,271,089 A | 12/1993 | Ozawa ..................... 395/200 |
| 5,281,489 A | 1/1994 | Mori et al. |
| 5,486,406 A | 1/1996 | Shi |
| 5,513,499 A | 5/1996 | DeRijke |
| 5,635,308 A | 6/1997 | Inoue et al. |
| 5,719,467 A | 2/1998 | Antoniadis et al. |
| 5,817,431 A * | 10/1998 | Shi et al. ..................... 428/690 |
| 5,853,905 A | 12/1998 | So et al. ..................... 428/690 |
| 5,858,563 A | 1/1999 | Sano et al. |
| 5,925,472 A | 7/1999 | Hu et al. |
| 5,925,980 A | 7/1999 | So et al. ..................... 313/504 |
| 5,955,836 A | 9/1999 | Boerner et al. |
| 5,989,737 A | 11/1999 | Xie et al. |
| 6,030,715 A | 2/2000 | Thompson et al. |
| 6,097,147 A | 8/2000 | Baldo et al. |
| 6,121,727 A | 9/2000 | Kanai et al. |
| 6,130,001 A | 10/2000 | Shi et al. ..................... 428/690 |
| 6,132,280 A | 10/2000 | Tanaba et al. |
| 6,215,462 B1 | 4/2001 | Yamada et al. |
| 6,228,228 B1 | 5/2001 | Singh et al. |
| 6,237,529 B1 | 5/2001 | Spahn |
| 6,275,649 B1 | 8/2001 | Nagashima et al. |
| 6,284,050 B1 | 9/2001 | Shi et al. |
| 6,285,039 B1 | 9/2001 | Kobori et al. |
| 6,310,360 B1 | 10/2001 | Forrest et al. |
| 6,326,091 B1 | 12/2001 | Schoo et al. |
| 6,346,973 B1 * | 2/2002 | Shibamoto et al. ........... 349/69 |
| 6,368,730 B1 | 4/2002 | Kishimoto et al. |
| 6,372,154 B1 | 4/2002 | Li |
| 6,392,250 B1 | 5/2002 | Aziz et al. |
| 6,392,339 B1 | 5/2002 | Aziz et al. |
| 6,396,209 B1 | 5/2002 | Kido et al. |
| 6,413,656 B1 | 7/2002 | Thompson et al. |
| 6,432,255 B1 | 8/2002 | Sun et al. |
| 6,458,475 B1 | 10/2002 | Adachi et al. |
| 6,468,676 B1 | 10/2002 | Ueda et al. |
| 6,495,198 B2 | 12/2002 | Peng |
| 6,517,996 B1 | 2/2003 | Chao et al. |
| 6,528,824 B2 | 3/2003 | Yamagata et al. |
| 6,541,909 B1 | 4/2003 | Motomatsu |
| 6,558,817 B1 | 5/2003 | Ueda et al. .................. 428/690 |
| 6,566,807 B1 | 5/2003 | Fujita et al. |
| 6,603,140 B2 | 8/2003 | Kobori et al. |
| 6,614,175 B2 | 9/2003 | Aziz et al. |
| 6,831,406 B1 | 12/2004 | Fukuyama et al. ......... 313/504 |
| 2001/0051207 A1 | 12/2001 | Yamagata et al. |
| 2002/0018912 A1 | 2/2002 | Jung et al. |
| 2002/0038867 A1 | 4/2002 | Kobori et al. |
| 2002/0074935 A1 | 6/2002 | Kwong et al. |
| 2002/0081767 A1 | 6/2002 | Kawashima |
| 2002/0086180 A1 | 7/2002 | Seo et al. |
| 2002/0093283 A1 | 7/2002 | Seo et al. |
| 2002/0101154 A1 | 8/2002 | Seo et al. |
| 2002/0105005 A1 | 8/2002 | Seo et al. |
| 2002/0109136 A1 | 8/2002 | Seo et al. |
| 2002/0113546 A1 | 8/2002 | Seo et al. |
| 2002/0121860 A1 | 9/2002 | Seo et al. |
| 2002/0139303 A1 | 10/2002 | Yamazaki et al. |
| 2002/0155632 A1 | 10/2002 | Yamazaki et al. |
| 2003/0010288 A1 | 1/2003 | Yamazaki et al. |
| 2003/0118950 A1 | 6/2003 | Chao et al. |
| 2003/0134145 A1 | 7/2003 | Toguchi et al. |

FOREIGN PATENT DOCUMENTS

| | | |
|---|---|---|
| EP | 1065737 A2 * | 1/2001 |
| EP | 1 220 340 | 7/2002 |
| JP | 03-114197 | 5/1991 |
| JP | 04-357694 | 10/1992 |
| JP | 04-357694 | 12/1992 |
| JP | 10-233288 | 9/1998 |
| JP | 2000-208262 | 7/2000 |
| JP | 2001-023776 | 1/2001 |
| JP | 2001-52870 | 2/2001 |
| TW | 243470 | 3/1995 |
| TW | TW-366598 | 8/1999 |
| TW | 451601 | 8/2001 |
| WO | WO 98/08360 | 2/1998 |
| WO | WO 02/47457 | 6/2002 |

OTHER PUBLICATIONS

Naka et al., "Organic Electroluminescent Devices Using a Mixed Single Layer," *Japanese Journal of Applied Physics*, vol. 33, Part 2, No. 12B, pp. L1772–1774, 1994.

Tang et al. "Organic electroluminescent diodes." Applied Physics Letters 51(12): 1987. p. 913–915.

Kijima et al. "A blue organic light emitting diode." Jpn. J. Appl. Phys. 38: 1999. p. 5274–5277.

C. Adachi et al. "Electroluminescence in organic films with three–layer structure." Jpn. J. Appl. Phys. 27(2): 1988. p. L269–L271.

C.W. Tang et al. "Electroluminescence of doped organic thin films." J. Appl. Phys. 65(9): 1989. p. 3610–3616.

"New Aspect of Research and Development of Organic EL." M&BE Seminar, Bulletin of Organic Molecular/Bioelectronics Subcommittee, Society of Applied Physics, 11(1): 2000. pp. 3–12.

T. Wakimoto et al. "Organic EL cells using alkaline metal compounds as electron injection materials." IEEE Transactions on Electron Devices 44(8): 1997. pp. 1245–1248.

S.A. Van Slyke et al. "Organic electroluminescent devices with improved stability." Appl. Phys. Lett. 69(15): 1996. pp. 2160–2162.

D.F. O'Brien et al. "Improved energy transfer in electrophosphorescent devices." Appl. Phys. Lett. 74(3): 1999. pp. 442–444.

T. Tsutsui et al. "The operation mechanism and the light emission efficiency of the organic EL element." Text of the Third Lecture Meeting, Bulletin of Organic Molecular/Bioelectronics Subcommittee, Society of Applied Physics, pp. 31–37.

J. Kido et al. "Multilayer white light–emitting organic electroluminescent device." Science 267: 1995. pp. 1332–1334.

T. Tsutsui et al. "High quantum efficiency in organic light–emitting devices with iridium–complex as a triplet emissive center." Jpn. J. Appl. Phys. 38: 1999. p. L1502–L1504.

Satoshi Seo et al., U.S. Appl. No. 10/043,786, filed Jan. 10, 2002.

Satoshi Seo et al., U.S. Appl. No. 10/043,812, filed Jan. 10, 2002.

Satoshi Seo et al., U.S. Appl. No. 10/060,427, filed Jan. 29, 2002.

Shunpei Yamazaki et al., U.S. Appl. No. 10/062,005, filed Jan. 31, 2002.

Shunpei Yamazaki et al., U.S. Appl. No. 10/072,310, filed Feb. 5, 2002.

Shunpei Yamazaki et al., U.S. Appl. No. 10/081,971, filed Feb. 20, 2002.

Satoshi Seo et al., U.S. Appl. No. 10/081,558, filed Feb. 20, 2002.

Hirokazu Yamagata et al., U.S. Appl. No. 09/852,090, filed May 10, 2001.

Satoshi Seo et al., U.S. Appl. No. 10/026,064, filed Dec. 21, 2001.
Satoshi Seo et al., U.S. Appl. No. 10/024,699, filed Dec. 21, 2001.

Invitation to Respond to Written Opinion w/International Search Report, 6 pages, Jun. 10, 2004.

* cited by examiner

One Frame

SF1-SF6: subframe, $T_A$: writing time

LIGHT EMITTING DEVICE

BACKGROUND OF THE INVENTION

1. Field of the Invention

The present invention relates to a light emitting device using an organic light emitting element having an anode, a cathode, and a film containing an organic compound in which light emission can be obtained by applying an electric field (hereafter referred to as an "organic compound film"). In particular, the present invention relates to a light emitting device using organic light emitting elements having a driver voltage that is lower than a conventional driver voltage and having a long life. Note that the term light emitting device within this specification indicates image display devices or light emitting devices using organic light emitting elements as light emitting elements. Further, modules in which a connector, for example, an anisotropic conductive film (flexible printed circuit, FPC), a TAB (tape automated bonding) tape, or a TCP (tape carrier package) is attached to organic light emitting elements, modules in which a printed-wiring board is provided on the tip of the TAB tape or the TCP, and modules in which an IC (integrated circuit) is directly mounted to the organic light emitting elements by a COG (chip on glass) method are all included in the category of the light emitting devices.

2. Description of the Related Art

Organic light emitting elements are elements which emit light by the application of an electric field. The light emitting mechanism is one in which electrons injected from a cathode recombine within an organic compound film with holes injected from an anode, forming excitation state molecules (hereafter referred to as "molecular excitons"), by the application of a voltage between the electrodes sandwiching the organic compound film. Energy is released when the molecular excitons return to a base sate, thereby emitting light.

Note that it is possible for the molecular excitons formed by the organic compound to be in a singlet excitation state or in a triplet excitation state, and both cases in which either excitation state may contribute to the emission of light are included within this specification.

The organic compound film is normally formed by a thin film having a thickness less than 1 μm for these types of organic light emitting elements. Further, organic light emitting elements are self light emitting elements in which light is emitted by the organic compound films themselves, and therefore a back light like that is used in a conventional liquid crystal display is not necessary. Consequently, the ability to manufacture the organic light emitting elements that are extremely thin and light is a big advantage.

Furthermore, the amount of time from the injection of a carrier until recombination in an organic compound film having a thickness on the order of 100 to 200 nm, for example, is on the order of several tens of nanoseconds when considering carrier mobility of the organic compound film, and even in a case of including a process from when the carrier recombines until light is emitted, the light emission can be reached within one microsecond. Therefore, it is one of the characteristics that light emitting elements have an extremely fast response speed.

In addition, drive using a direct current voltage is possible because the organic light emitting elements are light emitting elements of a carrier injecting type, and therefore it is difficult for noise to develop. With regard to a driver voltage, it has been reported (reference 1: Tang, C. W., and VanSlyke, S. A., "Organic Electroluminescent Diodes", Applied Physics Letters, Vol. 51, No. 12, pp. 913–915 (1987)) that a sufficient brightness of 100 cd/m$^2$ at 5.5 V was achieved by first taking an extremely thin film of an organic compound with a uniform film thickness on the order of 100 nm, selecting an electrode material so as to make a carrier injection barrier of the organic compound film smaller, and in addition, introducing a heterostructure (two layer structure).

Organic light emitting elements are therefore under the spotlight as display elements for next generation flat panel display elements due to their thin size, light weight, high speed response, and dc low-voltage drive. Furthermore, the organic light emitting elements are of a self light emitting type and have a wide field of view, and therefore their visibility is comparatively good and they are considered to be effective as elements used in the display screens of portable devices.

An Mg:Ag alloy having a low work coefficient and which is relatively stable is used in the cathode as a method of making the carrier injection barrier with respect to the organic compound film smaller, thereby increasing the electron injection properties, in the organic light emitting elements shown in reference 1. It is thus possible to inject a large amount of carrier into the organic compound film.

In addition, applying a single heterostructure in which a hole transporting layer formed of an aromatic diamine compound and an electron transporting and light emitting layer formed of tris-(8-quinolinolate)-aluminum (hereafter referred to as "Alq$_3$") are laminated as the organic compound film remarkably increases the efficiency of the recombination property of the carrier. This will be explained as follows.

For example, if the organic light emitting elements have only a single layer of Alq$_3$, then almost all electrons injected from the cathode will reach the anode without recombining with holes because Alq$_3$ has electron transporting properties, and the efficiency of light emission is extremely bad. That is, in order to make the efficiency of single layer organic light emitting elements better (or in order to perform drive at a low voltage), it is necessary to use a material capable of transporting both electrons and holes with a good balance (hereafter referred to as a "bipolar material"). Alq$_3$ does not satisfy this condition.

However, provided that a single heterostructure like that of reference 1 is applied, electrons injected from the cathode are blocked by an interface between a hole transporting layer and an electron transporting and light emitting layer, and are confined within the electron transporting and light emitting layer. Carrier recombination therefore occurs with good efficiency in the electron transporting and light emitting layer, and light emission having good efficiency is achieved.

Expanding upon the concept of a blocking function of this type of carrier, it becomes easy to control the carrier recombination region. For example, it has been reported that a hole transporting layer has been successfully made to emit light by confining holes within the hole transporting layer through inserting a layer capable of blocking holes (hole blocking layer) between a hole transporting layer and an electron transporting layer. (reference 2: Kijima, Y., Asai, N., and Tamura, S., "A Blue Organic Light Emitting Diode", Japanese Journal of Applied Physics. Vol. 38, pp. 5274–5277 (1999)).

Further, the organic light emitting elements of reference 1 perform separation of functions in that hole transportation is performed by the hole transporting layer, and electron transportation and light emission are performed by the electron transporting and light emitting layer. The concept of the function separation is further expanded upon to the concept of a double heterostructure (three-layered structure) in which a light emitting layer is sandwiched by a hole transporting layer and an electron transporting layer (reference 3: Adachi, C., Tokoto, S., Tsutsui, T., and Saito, S., "Electroluminescence in Organic Films with a Three-layered Structure", Japanese Journal of Applied Physics, Vol. 27, No. 2, pp. L269–L271 (1988)).

An advantage of the so-called separation of functions is that the need to make one type of organic material possess several types of functions (such as the ability to emit light, carrier transporting properties, the ability to inject carriers from electrodes), and therefore separation of functions provides a wide ranging amount of freedom in molecular design and the like (for example, there is no longer a need to search unreasonably for a bipolar material). In other words, high efficiency light emission can be easily achieved by combining materials such as a material having good light emitting properties and a material with superior carrier transporting properties, respectively.

The lamination structure discussed in reference 1 therefore enjoys widespread use at present due to these advantages (carrier blocking function and separation of functions).

However, interface boundaries (hereafter referred to as "organic interfaces") develop between each layer with a lamination structure like that discussed above because the structure is made of junction of different types of substances. Two problems which have their origin in the formation of organic interfaces are presented below.

First, one problem is hindrance of an additional reduction in a driver voltage. It has been reported for organic light emitting elements that in practice, single layer structure elements using a conjugate polymer are superior with regard to the driver voltage, and that top data power efficiency (units of 1 m/W) is maintained (compared to light emission from a singlet excitation state). (reference 4: Tsutsui, T., J. Applied Physics Society Organic Molecules—Bio-electronics Section, Vol. 11, No. 1, p. 8 (2000). (However, this is compared to light emission from a singlet excitation state, and excludes light emitted from a triplet excitation state.)

Note that the conjugate polymers discussed in reference 4 are bipolar materials, and that a level of carrier recombination efficiency equivalent to that of a lamination structure can be achieved. In practice, a single layer structure having few organic interfaces therefore shows a lower driver voltage provided that the carrier recombination efficiency can be made equivalent, without the use of a lamination structure, by a method such as using a bipolar polymer. This eventually suggests that carrier mobility in the organic interface is hindered.

In addition, another problem originates in an organic interface is exertion of influence on the element lifetime (element deterioration) for organic light emitting elements. Namely, brightness drops because the carrier mobility is impeded and charge accumulates.

No definite theory has been established regarding the mechanism of this degradation, but it has been reported that the drop in brightness can be suppressed by inserting a hole injecting layer between the anode and the hole transporting layer, and in addition, by performing ac drive at a short wavelength instead of dc drive (reference 5: VanSlyke, S. A., Chen, C. H., and Tang, C. W., "Organic Electroluminescent Devices with Improved Stability", Applied Physics Letters, Vol. 69, No. 15, pp. 2160–2162 (1966)). This can be said to be experimental evidence that the reduction in brightness can be suppressed in accordance with eliminating charge accumulation by inserting the hole injecting layer and by using ac drive.

From the above discussion, the lamination structure has the merits of being able to easily increase the carrier recombination efficiency (carrier blocking function), and being able to increase the breadth of selection of materials (separation of functions). However, carrier mobility is suppressed due to the formation of organic interfaces, in particular interfaces which block carriers, and this in turn influences the reductions in the driver voltage and in brightness.

SUMMARY OF THE INVENTION

An object of the present invention is to eliminate organic interfaces existing within an organic compound film, thereby increasing carrier mobility, by manufacturing elements that differ in concept from lamination structure conventionally used, and at the same time, to express function of a plurality of materials (hereafter referred to as "function expression") similar to the function separation of the lamination structure. In addition, an object of the present invention is to provide organic light emitting elements having a lower driver voltage than, and a longer element lifetime than, conventional elements using function expression.

Further, an object of the present invention is to provide a light emitting device having a lower driver voltage than, and a longer lifetime than, conventional devices by using the organic light emitting elements. In addition, an object of the present invention is to provide electronic equipment that has a lower electric power consumption than, and a longer lifetime than, conventional electronic equipment by manufacturing the electronic equipment using the above-mentioned light emitting device.

The inventors of the present invention considered the two mechanisms which will be discussed below as models for inhibiting carrier mobility by forming an organic interface.

First, one mechanism developing from the morphology of the organic interface was considered. An organic compound film in an organic light emitting element is normally an amorphous state film, and is formed by aggregation of molecules of the organic compound in accordance with forces between molecules, mainly dipolar interactions. However, if a heterostructure is formed using this type of molecular aggregate, then there is the possibility of that the difference in molecular size and shape will have a great influence in the heterostructure interface (namely, the organic interface).

In particular, the conformity of junction in the organic interface is thought to become worse for cases in which a heterostructure is formed using materials having large differences in their molecular size. A conceptual diagram thereof is shown in FIG. 1. A first layer 111 made from small molecules 101 and a second layer 112 made from large molecules 102 are laminated in FIG. 1. A region 114 having poor conformity develops in an organic interface 113 in this case.

There is a possibility that the poor conformity region 114 shown in FIG. 1 will become a barrier (or energy barrier) which inhibits carrier mobility, and this suggests that it hinders the driver voltage from being additionally reduced. Furthermore, carriers unable to overcome the energy barrier accumulate as a charge, and there is a possibility that this will cause a drop in brightness as discussed above.

Another mechanism developing from processes of forming the lamination structure (namely, forming the organic interface) was also considered. Organic light emitting elements are normally manufactured using a multi-chamber method (in-line method) evaporation apparatus in order to avoid contamination when forming each layer of the lamination structure, as shown in FIG. 2.

An evaporation apparatus for forming a three layered structure of a hole transporting layer, a light emitting layer, and an electron transporting layer (a double heterostructure) is shown in the example of FIG. 2. First, a substrate having anodes (such as indium tin oxide (hereafter referred to as "ITO")) is carried into an entrance chamber, and cleaning of the anode surface is performed by irradiating ultraviolet light within a vacuum atmosphere in an ultraviolet irradiation chamber. In particular, oxidation processing is performed in this processing chamber for cases in which the anode is an oxide such as ITO. In addition, hole transporting layers are formed in an evaporation chamber 201, light emitting layers (three colors: red, green, and blue in FIG. 2) are formed in evaporation chambers 202 to 204, electron transporting layers are formed in an evaporation chamber 205 and cathodes are formed in an evaporation chamber 206 in order to form each layer of the lamination structure. Sealing is performed lastly in a sealing chamber, and the organic light emitting elements are taken out from an exit chamber.

A feature of this type of in-line method evaporation apparatus is that the evaporation of each layer is performed in different evaporation chambers, namely the evaporation chambers 201 to 205, respectively. In other words, this is an apparatus structure in which materials for each layer do not mix with each other.

Incidentally, although the inside of the evaporation apparatus is reduced in pressure to normally be on the order of $10^{-4}$ to $10^{-5}$ Pa, a very small amount of gaseous components (such as oxygen and water) remain. Even with this very small amount of gaseous components, an adsorbed layer on the order of a single molecular layer is easily formed in several seconds at this level of vacuum.

A large interval therefore develops between the formation of each layer when manufacturing organic light emitting elements of lamination structures using an apparatus like that of FIG. 2. In other words, there is a fear that adsorbed layers (hereafter referred to as "impurity layers") will form due to a very small amount of gaseous components during the intervals between the formation of each layer, in particular when conveying occurs via a second conveyor chamber.

A conceptual diagram of such is shown in FIG. 3. FIG. 3 shows a state in which an impurity layer 313 composed of a very small amount of an impurity 303 (such as water or oxygen) is formed between a first layer 311 made from a first organic compound 301, and a second layer 312 made from a second organic compound 302, during lamination of the two layers.

The impurity layer thus formed between each of the layers (namely, an organic interface) becomes an impurity region that traps carriers, thereby inhibiting the mobility of the carriers, after completion of the organic light emitting elements, and therefore the driver voltage is increased. In addition, charge will accumulate in the carrier trapping an impurity region if it exists, and therefore there is a possibility of inducing a reduction in brightness like that discussed above.

Considering this type of mechanism, it is necessary to go beyond conventional lamination structure elements for both the element structure and the manufacturing processes in order to overcome the problems which develop in the organic interface (deterioration of the morphology of the organic interface and formation of an impurity layer) discussed above. For example, organic light emitting elements having only a single layer, in which a hole transporting material is mixed with an electron transporting material (hereafter referred to as a "mixed single layer"), formed between two electrodes have been reported as examples of organic light emitting elements which completely eliminate organic interfaces (reference 6: Naka, S., Shinno, K. I, Okada, H., Onnagawa, H., and Miyashita, K., "Organic Electroluminescent Devices Using a Mixed Single Layer", Japanese Journal of Applied Physics, Vol. 33, No. 12B, pp. L1772–L1774 (1994)).

A single layer structure is formed in reference 6 by mixing 4,4'-bis[N-(3-methylphenyl)-N-phenyl-amino]-biphenyl (hereafter referred to as "TPD") with $Alq_3$, which have hole transporting properties and electron transporting properties, respectively, in a ratio of 1:4. However, it is shown that the single layer structure is inferior compared to a lamination structure (namely, a heterostructure made from TPD and $Alq_3$ and in which an organic interface is formed) from the point of light emission efficiency. Although the efficiency of light emission can be greatly improved by doping a light emitting material, there is still a certain amount of inferiority compared to a lamination structure doped with a light emitting material.

The cause for this is thought to be that holes injected from the anode and electrons injected from the cathode tend to pass through to the opposite electrode without recombining in the mixed single layer case. The lamination structure has a carrier blocking function, and therefore this type of problem does not develop.

In other words, this is because function expression is not performed in the mixed single layer of reference 6. That is, if regions capable of expressing each of the functions are not formed, for example a region near the anode exhibits a hole transporting function, a region near the cathode exhibits an electron transporting function within the organic compound film, and light emitting regions (regions in which the carriers recombine) are formed in portions separated from both the electrodes, then light emission with good efficiency cannot be achieved even if the organic interfaces are eliminated.

In consideration of these points, the inventors of the present invention proposed a method for achieving organic light emitting elements that differ from those of reference 6 but which are capable of function expression and in which organic interfaces are eliminated. A conceptual diagram of such is shown in FIG. 4. Note that, although an anode 402 is formed on a substrate 401 here, a reversed structure in which a cathode 404 is formed on the substrate may also be used.

A hole transporting region 405 made from a hole transporting material 430, an electron transporting region 409 made from an electron transporting material 431, and a mixture region 407 in which the hole transporting material and the electron transporting material are mixed at a fixed ratio (hereafter referred to as "x:y") are formed in an organic compound film 403 containing the hole transporting material and the electron transporting material for elements shown in FIG. 4. A light emitting region 432 is formed in the mixture region 407 by adding a light emitting material 410 which emits light.

In addition, a first concentration change region 406 and a second concentration change region 408 are formed between the mixture region 407 and the hole transporting region 405, and between the mixture region 407 and the electron transporting region 409, respectively. A concentration gradient is formed in the concentration change regions so that the concentration ratio gradually becomes closer to the x:y ratio of the mixture region. A schematic diagram of the concentration profile is shown in FIG. 5.

The hole transporting material can receive and transport holes at the anode side, and on the other hand the electron transporting material can receive and transport electrons at the cathode side when this type of element is formed. Further, a gentle concentration gradient is formed in the concentration change regions 406 and 408 so as to avoid a sudden concentration change (the most extreme example of a sudden change is a conventional heterostructure, in which the concentration changes from 0% to 100%, or from 100% to 0%), and therefore the energy barrier with respect to the carriers can be nearly eliminated.

The carrier input to the organic compound film 403 is therefore transported smoothly to the mixture region 407 without being obstructed by a large energy barrier. This is a very important role that the concentration change regions 406 and 408 play. In addition, the mixture region 407 has bipolarity, and therefore it becomes possible for both the holes and electrons to move in the mixture region 407.

What is important here is that the light emitting region containing the light emitting material is formed in the mixture region 407. In other words, carriers can be prevented from passing through the mixture region without recombining, and at the same time the light emitting region is kept away from the electrodes and disruption of light by the electrodes (hereafter referred to as "quenching") can be prevented, by adding the light emitting material 410 to the mixture region 407. Regions in which each function (carrier transport and light emission) can be expressed thus exist within the organic compound film 403, differing from the mixed single layer of reference 6.

In addition, organic interfaces like those of conventional lamination structures do not exist within this type of element. The aforementioned problems that develop at the above-mentioned organic interface (morphology deterioration of the organic interface and formation of an impurity layer) can therefore be solved.

First, an explanation of how the morphology deterioration of the organic interface is resolved is made using FIG. 6. FIG. 6 is a cross section of an organic compound film made from a region 611 composed of small molecules 601, a region 612 composed of large molecules 602, and a mixture region 613 containing both the small molecules 601 and the large molecules 602. Note that a concentration change region has been omitted here for convenience in the figure. FIG. 6 makes clear that an organic interface like the organic interface 113 of FIG. 1 does not exist here, and that the region 114 having poor conformity does not exist either.

Further, formation of an impurity layer is resolved. When manufacturing organic light emitting elements like those of FIG. 4, the hole transporting material is initially formed on the anode by evaporation, then, during the evaporation of the hole transporting material, an electron transporting material is stated to be co-evaporated in addition to the hole transporting material whereby the mixture region is formed, and then, the evaporation of the hole transporting material is stopped while the evaporation of the electron transporting material is continued. An interval that arises during manufacturing of organic light emitting elements when using an evaporation apparatus like that of FIG. 2 therefore does not exist. Namely, no opportunity is provided for the formation of an impurity layer.

Organic interfaces are thus not formed in the organic light emitting elements of the present invention, and therefore carrier mobility is smooth and no adverse influence is exerted on the driver voltage or the element lifetime. In addition, there is function separation similar to that of a lamination structure, and thus there are no problems relating to efficiency of light emission.

Furthermore, the structure of the present invention has a mixed-junction and not the hetero-junction between different substances with a conventional lamination structure, and the light emitting elements of the present invention are based upon a novel concept.

Therefore, with the present invention, a light emitting device is formed having an organic light emitting element, the organic light element having:
  an anode;
  a cathode; and
  an organic compound film containing a hole transporting material and an electron transporting material;
  wherein:
  the organic compound film has a structure in which:
    a hole transporting region made from the hole transporting material;
    a first concentration change region in which the proportion of the electron transporting material increases gradually until a ratio between the hole transporting material and the electron transporting material becomes x:y (where x and y are positive constants);
    a mixture region containing the hole transporting material and the electron transporting material at the ratio of x:y;
    a second concentration change region in which the proportion of the electron transporting material gradually increases further from the x:y ratio; and
    an electron transporting region made from the electron transporting material;
  exist in order in a direction from the anode to the cathode; and
  a light emitting region, into which a light emitting material for performing light emission is added, is formed within the mixture region.

Note that it is preferable that the energy difference between a highest occupied molecular orbital (HOMO) and a lowest unoccupied molecular orbital (LUMO) of the light emitting material (hereafter referred to as "excitation energy level") be smaller compared to that of the hole transporting material and electron transporting material. This is in order to prevent energy mobility of molecular excitons of the light emitting material.

Further, a hole injecting region made from a material for enhancing injecting properties of holes (hereafter referred to as a "hole injecting material") may also be inserted between the anode and the organic compound film in FIG. 4. Furthermore, an electron injecting region made from a material for enhancing injecting properties of electrons (hereafter referred to as an "electron injecting material") may also be inserted between the cathode and the organic compound film. Both the hole injecting region and the electron injecting region may also be included.

The hole injecting material and the electron injecting material in this case are materials for reducing the carrier injecting barrier from the electrodes to the organic compound film, and therefore carrier mobility from the electrodes to the organic compound film is smooth. The materials have an effect of being capable of eliminating charge accumulation. However, from the viewpoint of avoiding formation of an impurity layer like that discussed above, it is preferable that no interval occurs in formation of the films between each of the injecting materials and the organic compound film.

Further, a carrier recombination portion is nearly determined by the mixture ratio in the mixture region (becoming closer to the center the more bipolar the ratio becomes). The light emitting material may therefore be added to the entire region within the mixture region (see FIG. 7A), and may be added to only a portion of the mixture region (see FIG. 7B).

In addition, a structure in which a blocking material 411 may be added to the mixture region 407, as shown in FIG. 8A. Note that although the anode 402 is formed on the substrate 401 here, an inverse structure in which the cathode 404 is formed on the substrate may also be used. Furthermore, the hole injecting region and the electron injecting region may also be formed between the electrodes and the organic compound film.

Note that the term blocking material denotes a material having the highest excitation energy among the materials contained in the mixture region 407 and which functions so as to block carriers. In addition, it functions so as to prevent the diffusion of molecular excitons. The carrier recombination rate in the mixture region 407 increases, and diffusion of molecular excitons is prevented if the blocking material 411 is added to the mixture region 407, and therefore a high light emission efficiency can be expected. However, blocking materials often have a blocking function for only holes or electrons, and therefore the carrier balance within the mixture region may break down if the blocking material is added throughout the entire mixture region. Accordingly, it is more preferable that the blocking material is added only to a portion of the mixture region.

Further, materials having a low HOMO level, namely those capable of blocking holes, are normally effective for the blocking material. The technique of adding the blocking material 411 to a place closer to the cathode side than the region in which the light emitting material 410 is added, as shown in FIG. 8B, is therefore effective.

In recent years, from the viewpoint of the light emitting efficiency, organic light emitting elements capable of transforming energy emitted when returning from a triplet excitation state to a base state (hereafter referred to as "triplet excitation energy") have been in the spotlight due to their high light emission efficiency (reference 7: O'Brien, D. F., Baldo, M. A., Thompson, M. E., and Forrest, S. R., "Improved Energy Transfer in Electrophosphorescent Devices", Applied Physics Letters, Vol. 74, No. 3, pp. 442–444 (1999); and reference 8: Tsutsui, T., Yang, M. J., Yahiro, M., Nakamura, K., Watanabe, T., Tsuji, T., Fukuda, Y., Wakimoto, T., and Miyaguchi, S, "High Quantum Efficiency in Organic Light-Emitting Devices with Iridium-Complex as a Triplet Emissive Center", Japanese Journal of Applied Physics, Vol. 38, pp. L1502–L1504 (1999)).

A metal complex in which platinum is a central metal, and a metal complex in which iridium is a central metal, are used in reference 7 and reference 8, respectively. Organic light emitting elements capable of converting these triplet excitation energy into light emission (hereafter referred to as "triplet light emitting elements") can achieve higher light emitting brightness, and high light emitting efficiency, than conventional light emitting elements.

However, the half-value period for the brightness for a case in which the initial brightness is set to 500 cd/m$^2$ is on the order of 170 hours in accordance with the example reported in reference 8, and this is a problem for the lifetime of the elements. A light emitting layer using a suitable host material with respect to a light emitting material and a blocking layer using a single blocking material for preventing the diffusion of molecular excitons are necessary for the triplet light emitting elements, and therefore becomes a lamination structure and a number of organic interfaces develop is thought to be a cause of the short element life.

Light emitting elements having extremely high function in which high brightness light emission and high light emitting efficiency in accordance with light emission from a triplet excitation state, and a long element lifetime, become possible by applying the present invention to triplet state light emitting elements. Note that triplet molecular excitons have a dispersion distance which is large in comparison with singlet molecular excitons, and therefore it is preferable that a blocking material be contained in a mixture region.

Incidentally, bipolarity is necessary for the mixture region, and therefore it is preferable to set the mass percentage of a hole transporting material to be greater than or equal to 10%, and less than or equal to 90%, with respect to the total mass of the hole transporting material and an electron transporting material. Note that this ratio is thought to vary considerably in accordance with the combination of the material.

Further, the mixture region contains a light emitting region in the present invention, namely a region in which carriers recombine, and therefore a thickness on an order such that carriers do not pass through is necessary. It is therefore preferable that the mixture region have a thickness equal to or greater than 10 nm.

DETAILED DESCRIPTION OF THE PREFERRED EMBODIMENTS

Embodiment Mode

An embodiment when implementing the present invention is discussed below. Note that at least one of an anode and a cathode must be transparent in order to extract light emission from an organic light emitting element. An element structure in which a transparent anode is formed on a substrate and light is extracted from the anode is discussed here. In practice, it is also possible to apply the present invention to a structure in which light is extracted form the cathode and to a structure in which light is extracted from the side opposite to that of the substrate.

Production processes for manufacturing organic light emitting elements become very important in order to prevent the formation of impurity layers when implementing the present invention. A method of manufacturing an organic light emitting element disclosed by the present invention is discussed first.

Figure 9A:
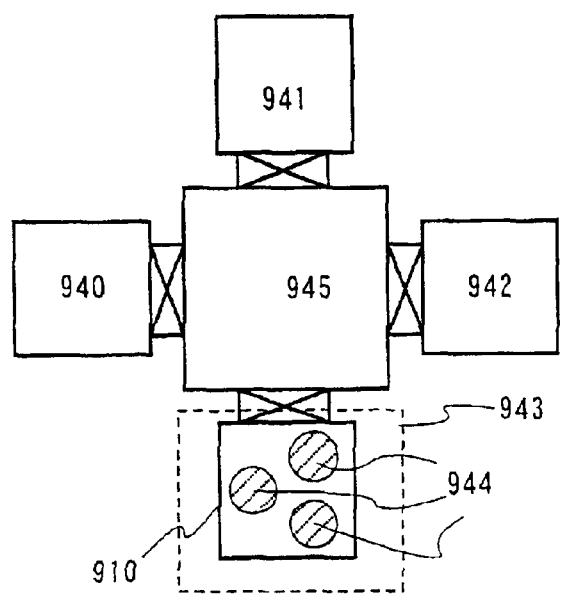
FIGS. 9A and 9B are diagrams showing an evaporation apparatus.

FIG. 9A is an upper surface diagram of an evaporation apparatus, and one vacuum chamber 910 is set up as an evaporation chamber 943, and a plurality of evaporation sources 944 are formed within the vacuum chamber, resulting in a single chamber method. Materials having different functions, such as a hole injecting material, a hole transporting material, an electron transporting material, an electron injecting material, a blocking material a light emitting material, and a cathode structuring material are stored separately in the respective plurality of evaporation sources.

A substrate having an anode (such as ITO) first goes into an entrance chamber 940 in this type of evaporation apparatus having an evaporation chamber, and oxidation processing is performed in a preprocessing chamber 941 if the anode is an oxide such as ITO (note that, although not shown in FIG. 9A, it is also possible to establish an ultraviolet irradiation chamber for cleaning the surface of the anode). In addition, all materials for forming the organic light emitting elements are evaporated within the vacuum chamber 910. However, the cathode may be formed within the vacuum chamber 910, and the cathode may also be formed in a separate evaporation chamber. The point is that a period up through forming the cathode may take place by evaporation within one vacuum chamber, the vacuum chamber 910. Sealing is performed lastly in a sealing chamber 942, the substrate is removed from an exit chamber, and the organic light emitting elements are thereby obtained. Note, 945 denotes a conveyor chamber.

Figure 9B:
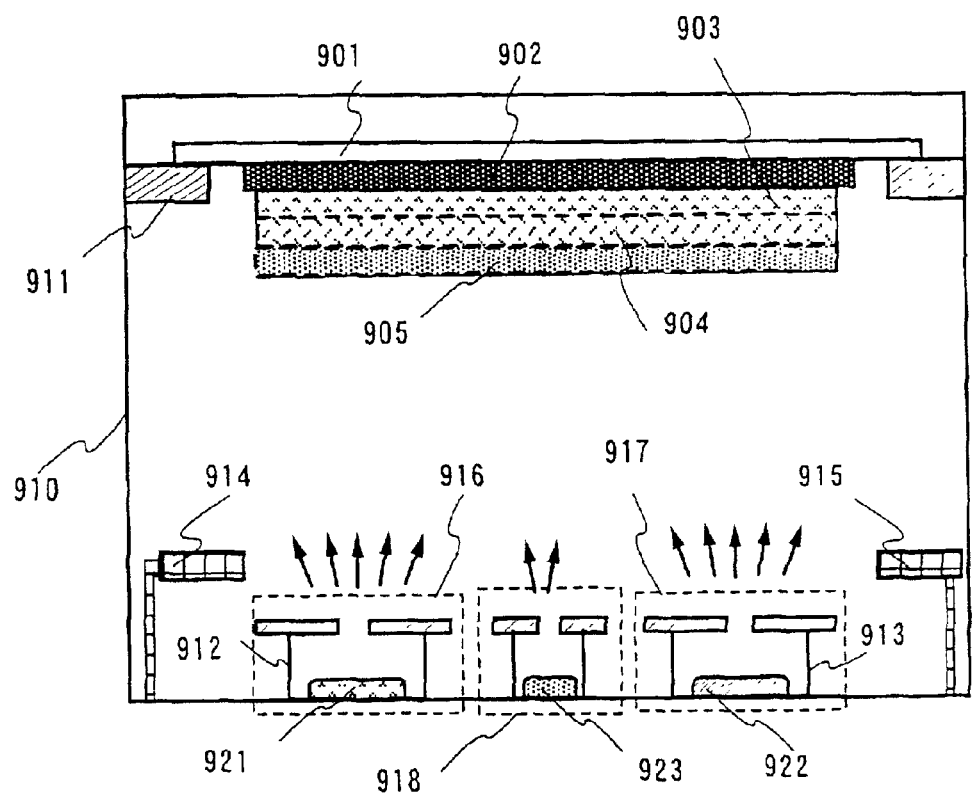

Processes for manufacturing the organic light emitting elements of the present invention using this type of single chamber method are explained using FIG. 9B (a cross sectional diagram of the vacuum chamber 910). A process of forming an organic compound film containing a hole transporting material 921, an electron transporting material 922, and a light emitting material 923 using the vacuum chamber 910 having three evaporation sources (an organic compound evaporation source a 916, an organic compound evaporation source b 917, and an organic compound evaporation source c 918) is shown in FIG. 9B as the simplest example.

First, a substrate 901 having an anode 902 enters the inside of the vacuum chamber 910, and is fixed to a fixture plate 911 (the substrate is normally rotated during evaporation). Next, the inside of the vacuum chamber 910 is reduced in pressure (preferably to $10^{-4}$ Pa or less), after which a container a 912 is heated, making the hole transporting material 921 evaporate, and a shutter a 914 is opened when a predetermined evaporation rate (units of Å/s) is achieved. Evaporation thus begins. A shutter b 915 remains closed at this point, and a container b 913 is also heated.

A shutter b 915 is gradually opened when a predetermined thickness of a hole transporting region 903 is achieved, and the evaporation rate of the electron transporting material 922 is increased. The shutter a 914 may remain open as is, and it may also be gradually closed, reducing the evaporation rate of the hole transporting material. A concentration gradient in a first concentration change region 904 is formed in accordance with the speeds for opening and closing the shutters at this time.

Next, shutter opening and closing operations are stopped at a point when a predetermined ratio x:y is achieved for the proportion of the hole transporting material 921 to the electron transporting material 922, and a mixture region 905 is formed at a constant evaporation rate. A very small amount of the light emitting material 923 may also be added here when forming the mixture region 905 (state shown in FIG. 9B).

The shutter a 914 is gradually closed when a predetermined thickness is reached for the mixture region 905, and the evaporation rate of the hole transporting material 921 is reduced. The shutter b 915 may be left as is, and it may also be gradually opened, thereby increasing the evaporation rate of the electron transporting material 922. A concentration gradient in a second concentration change region is formed in accordance with the speeds for opening and closing the shutters. In addition, the shutter a 914 is completely closed in order to form an electron transporting region, and heating of the container a 912 is stopped.

The aforementioned operations are all performed without causing any intervals to occur, and therefore impurity layers are not mixed into any of the regions.

It is possible to manufacture all of the organic light emitting elements discussed as means for resolving the objects of the present invention by applying this method. For example, an evaporation source for evaporating a blocking material may be established in FIG. 9B for cases in which the blocking material is added to the mixture region 905, and the blocking material may be evaporated during formation of the mixture region.

Further, for cases in which a hole injecting region and an electron injecting region are formed, evaporation sources for each injecting material may be set within the same vacuum chamber, the vacuum chamber 910. For example, if a hole injecting region is formed by evaporation between the anode 902 and the hole transporting region 903 in FIG. 9B, then formation of an impurity layer can be averted by evaporating the hole transporting material 921 immediately after evaporating a hole injecting material on the anode 902, without an interval.

Next, examples are given below of preferred materials for materials such as hole injecting materials, hole transporting materials, electron transporting materials, electron injecting materials, blocking materials, and light emitting materials.

Note that materials capable of being used in the organic light emitting elements of the present invention are not limited to the materials discussed below.

Porphyrin compounds are effective as hole injecting materials if an organic compound is used, such as phthalocyanine (hereafter referred to as "H2Pc") and copper phthalocyanine (hereafter referred to as "CuPc"). There are also materials in which chemical doping is performed to a conductive polymer compound, and materials such as polyethylene dioxythiofuran (hereafter referred to as "PEDOT") doped with polystyrene sulphonic acid (hereafter referred to as "PSS"), and polyaniline. Further, polymer compound insulators are also effective in leveling, and polyimide (hereafter referred to as "PI") is often used. In addition, inorganic compounds are also used, such as metallic thin films of gold or platinum, and ultra thin films of aluminum oxide (hereafter referred to as "alumina").

Aromatic amine compounds (namely, compounds having bonds between a benzene ring and nitrogen) are the most widely used as hole transporting materials. In addition to TPD discussed above, derivatives of TPD such as the starburst aromatic amine compounds 4,4'-bis[N-(1-naphthyl)-N-phenyl-amino]-biphenyl (hereafter referred to as "α-NPD"), 4,4',4"-tris(N,N-diphenyl-amino)-triphenylamine (hereafter referred to as "TDATA"), and 4,4',4"-tris[N-(3-methylphenyl)-N-phenyl-amino]-triphenylamine (hereafter referred to as "MTDATA") can be given as the widely used materials.

Metal complexes are often used as electron transporting materials, and metal complexes having quinoline skeletons or benzo quinoline skeletons, such as $Alq_3$, discussed above, tris(4-methyl-8-quinolinolate) aluminum (hereafter referred to as "$Almq_3$"), and bis(10-hydroxybenzo[h]quinolinate) beryllium (hereafter referred to as "$BeBq_2$") exist, as do materials such as the mixed ligand complex bis(2-methyl-8-quinolinolate)-(4-hydroxy-biphenyl)-aluminum (hereafter referred to as "BAlq"). Further, there are also metal complexes having oxazoles or thiazolate ligands, such as bis[2-(2-hydroxyphenyl)-benzooxazolate]zinc (hereafter referred to as "$Zn(BOX)_2$"), bis[2-(2-hydroxyphenyl)-benzothiazolate]zinc (hereafter referred to as "$Zn(BTZ)_2$"). In addition to metal complexes, oxadiazole derivatives such as 2-(4-biphenyl)-5-(4-tert-butylphenyl)-1,3,4-oxadiazole (hereafter referred to as "PBD") and 1,3-bis[5-(p-tert-butylphenyl)-1,3,4-oxadiazole-2-il]benzene (hereafter referred to as "OXD-7") also have electron transporting properties. Triazole derivatives such as 3-(4-tert-butylphenyl)-4-phenyl-5-(4-biphenyl)-1,2,4-triazole (hereafter referred to as "TAZ") and 3-(4-tert-butylphenyl)-4-(4-ethylphenyl)-5-(4-biphenilyl-1,2,4-triazole (hereafter referred to as "p-EtTAZ"), and phenanthroline derivatives such as vasophenanthrene (hereafter referred to as "BPhen") and vasocuproin (hereafter referred to as "BCP") also have electron transporting properties.

The electron transporting materials stated above can be used as electron injecting materials. In addition, ultra thin films of insulators of alkaline metal halogen compounds such as lithium fluoride, and alkaline metallic oxide such as lithium oxide are also often used. Furthermore, alkaline metal complexes such as lithium acetylacetate (hereafter referred to as "Li(acac)") and 8-quinolinolate-lithium (hereafter referred to as "Liq") are also effective.

The aforementioned materials BAlq, OXD-7, TAZ, p-EtTAZ, BPhen, BCP, and the like are effective as blocking materials due to their high excitation energy level.

In addition to metal complexes such as the aforementioned $Alq_3$, $Almq_3$, $BeBq_2$, BAlq, $Zn(BOX)_2$, and $Zn(BTZ)_2$, various types of fluorescent pigments are also effective as light emitting materials. Further, it is also possible to use triplet light emitting materials as tight emitting materials, and complexes having platinum or iridium as a central metal are mainly used. Materials such as tris(2-phenylpyridine) iridium (hereafter referred to as "$Ir(ppy)_3$") and 2,3,7,8,12,13,17, 18-octaethyl-21H,23H-porphyrin-platinum (hereafter referred to as "PtOEP") are known as triplet light emitting materials.

Organic light emitting elements having a lower driver voltage, and a longer element lifetime, than conventional light emitting elements can be manufactured by combining the materials having different functions that are discussed above and applying them to the organic light emitting elements of the present invention.

Embodiments

Embodiment 1

Figure 1:
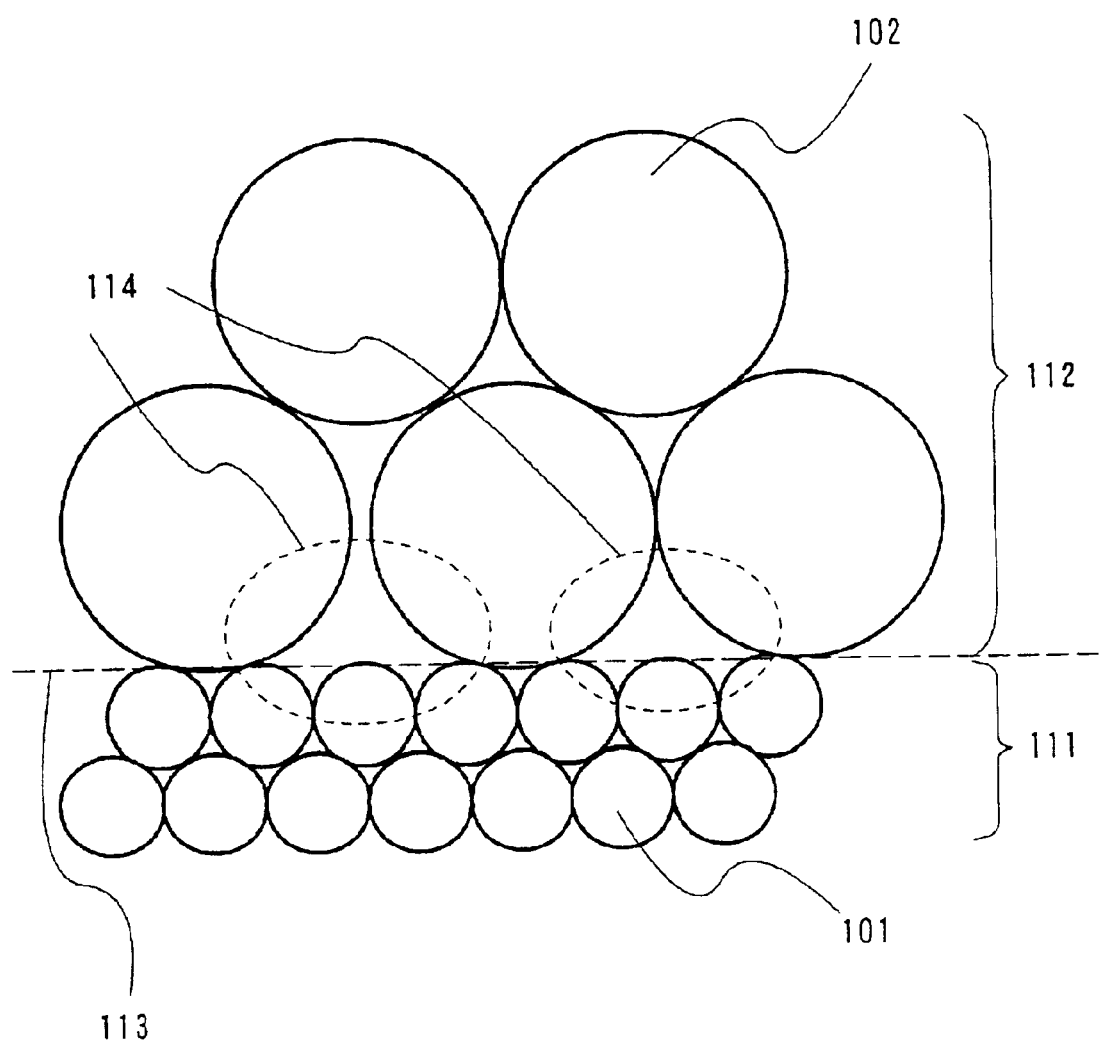
FIG. 1 is a diagram for expressing an organic interface state.
Figure 2:
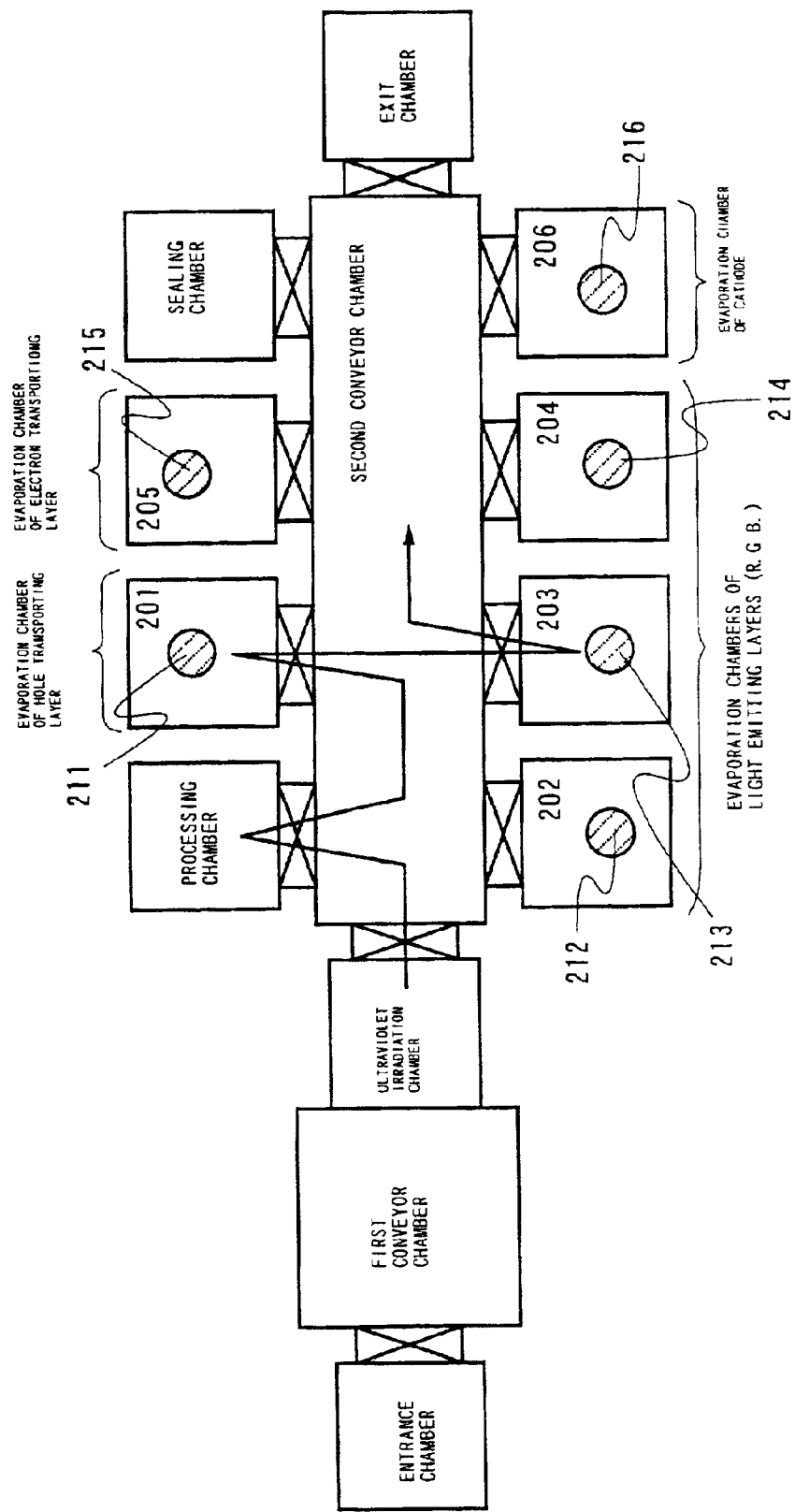
FIG. 2 is a diagram showing an evaporation apparatus.
Figure 3:
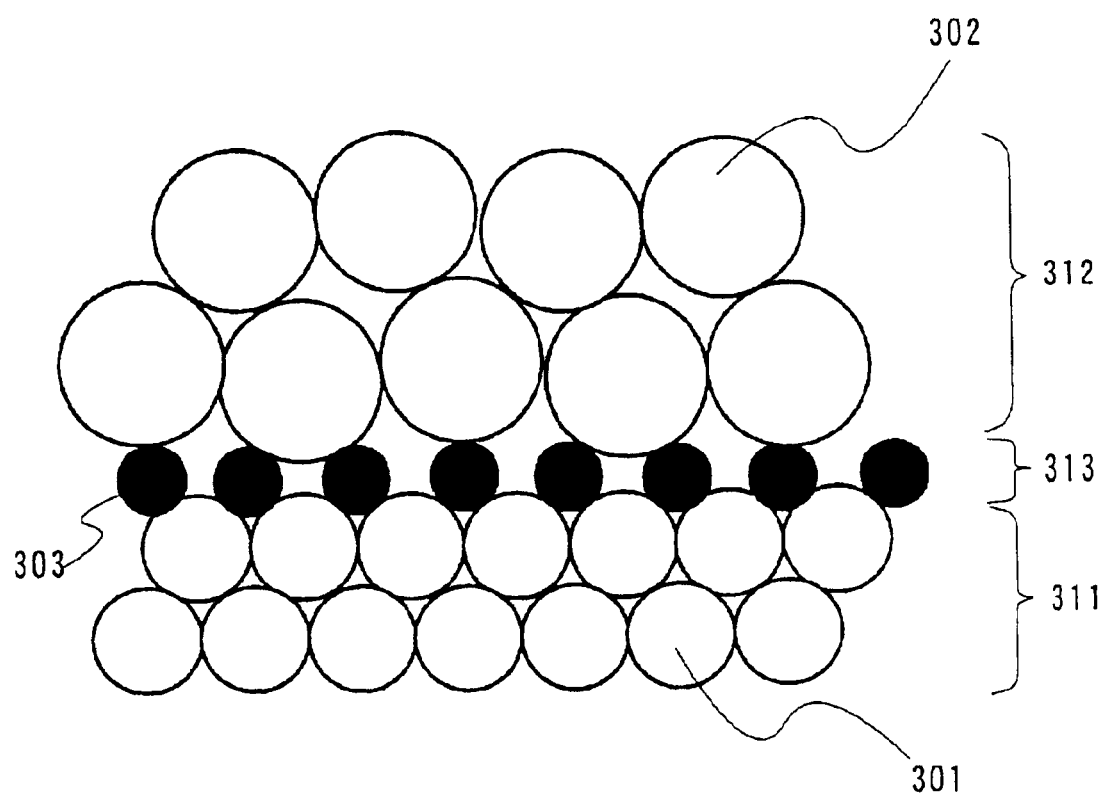
FIG. 3 is a diagram showing formation of an impurity layer.
Figure 4:
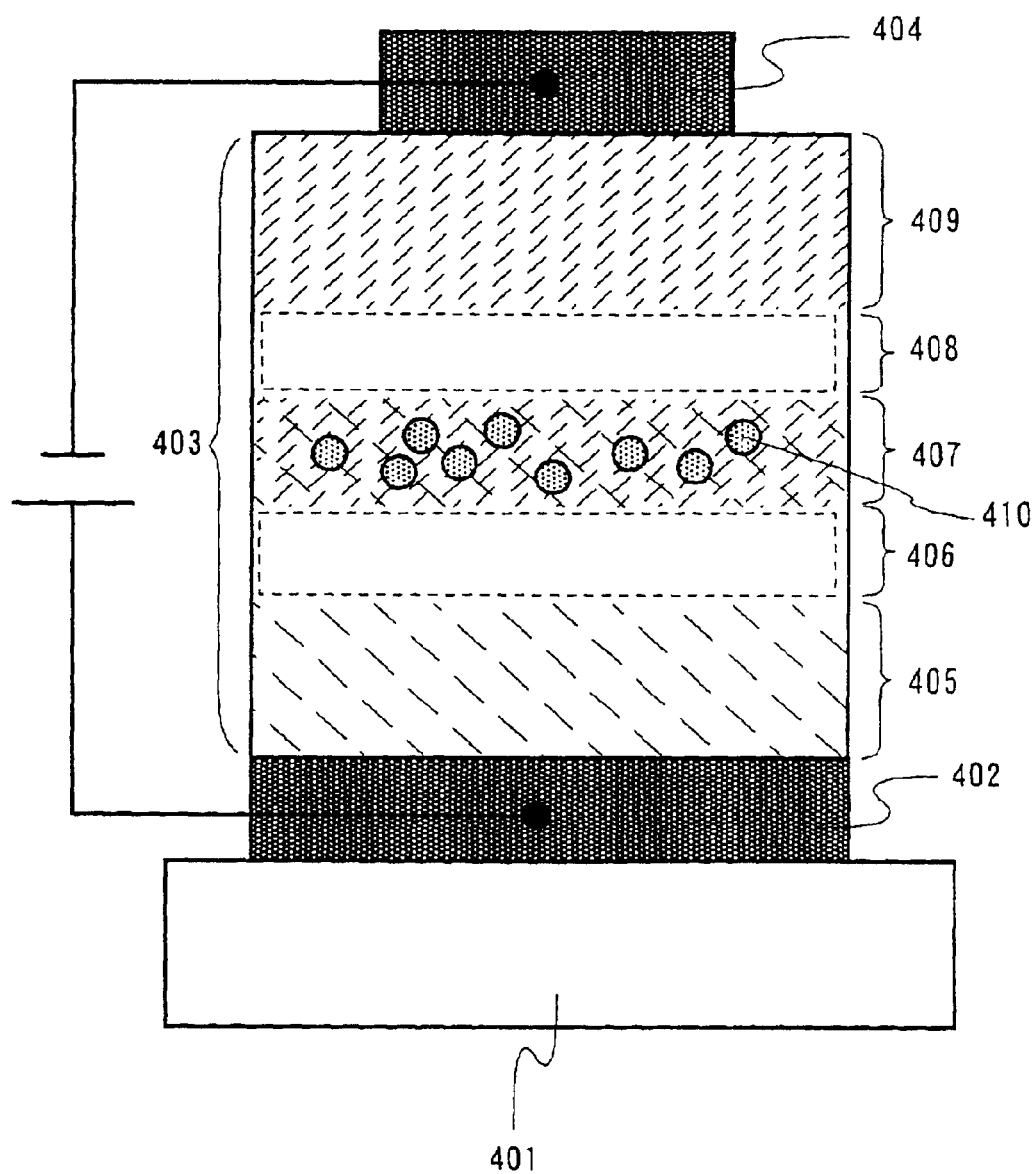
FIG. 4 is a diagram showing a structure of an organic light emitting element.
Figure 5:
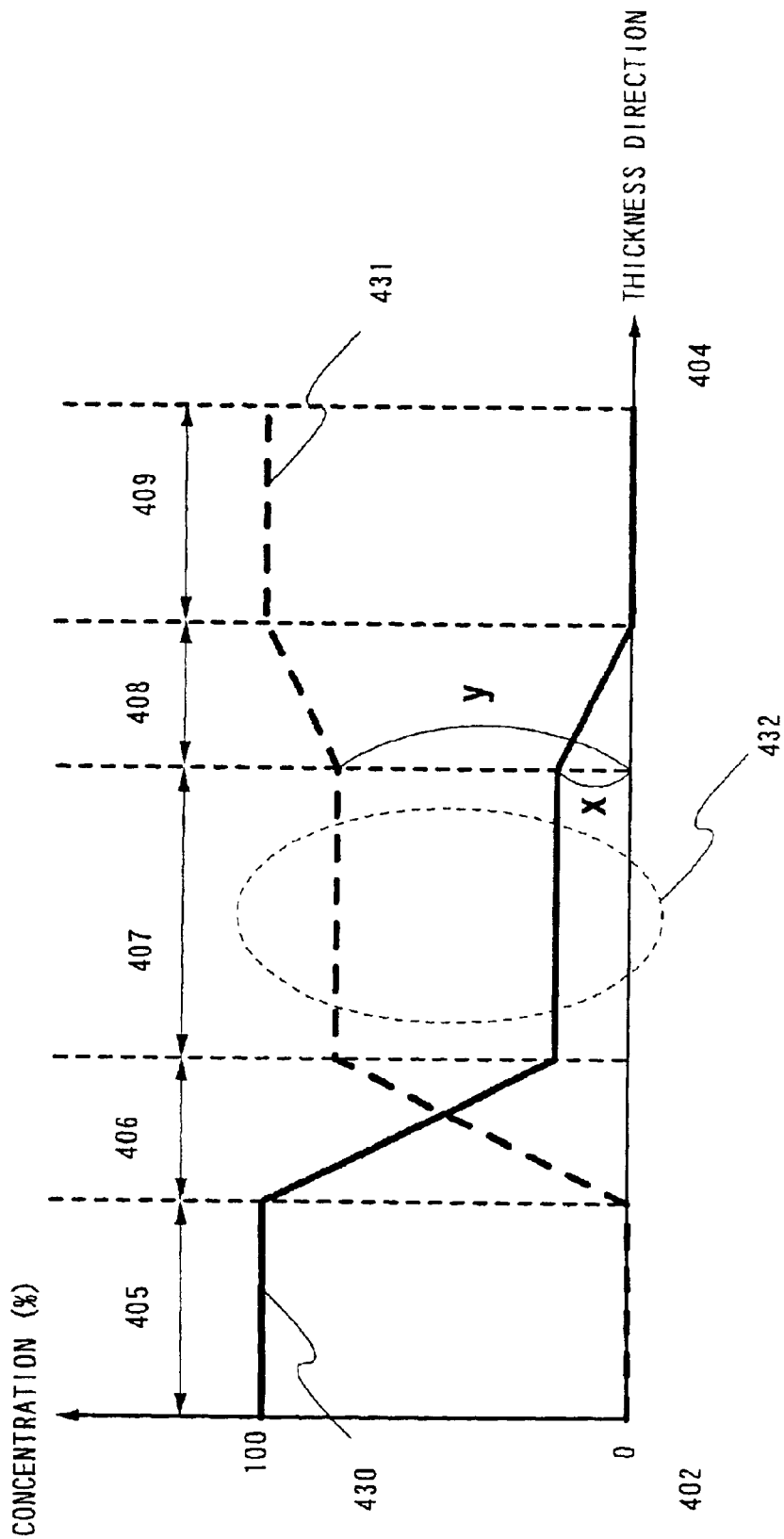
FIG. 5 is a diagram showing a concentration profile.
Figure 6:
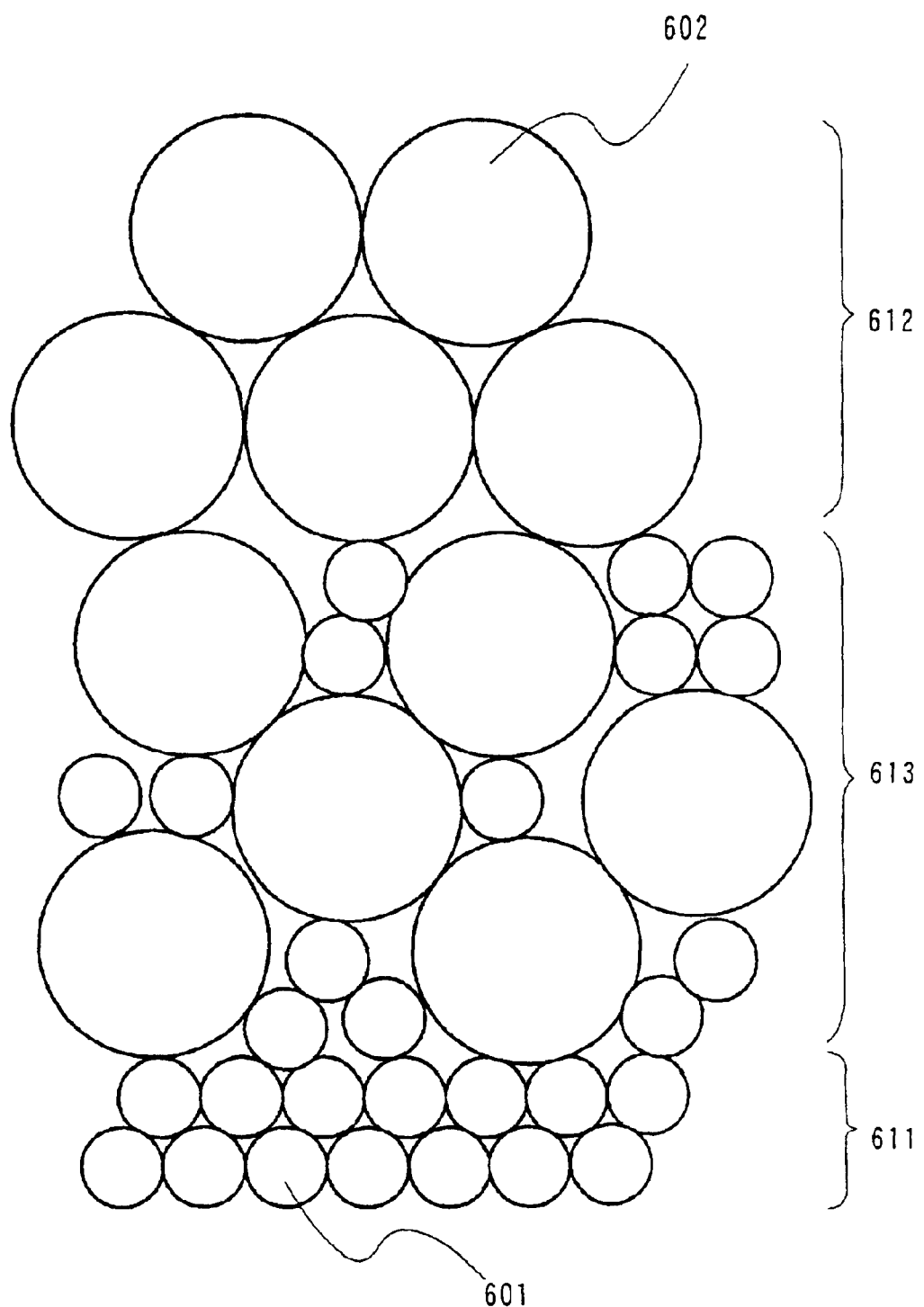
FIG. 6 is a diagram for expressing a mixture region state.
Figure 7A:
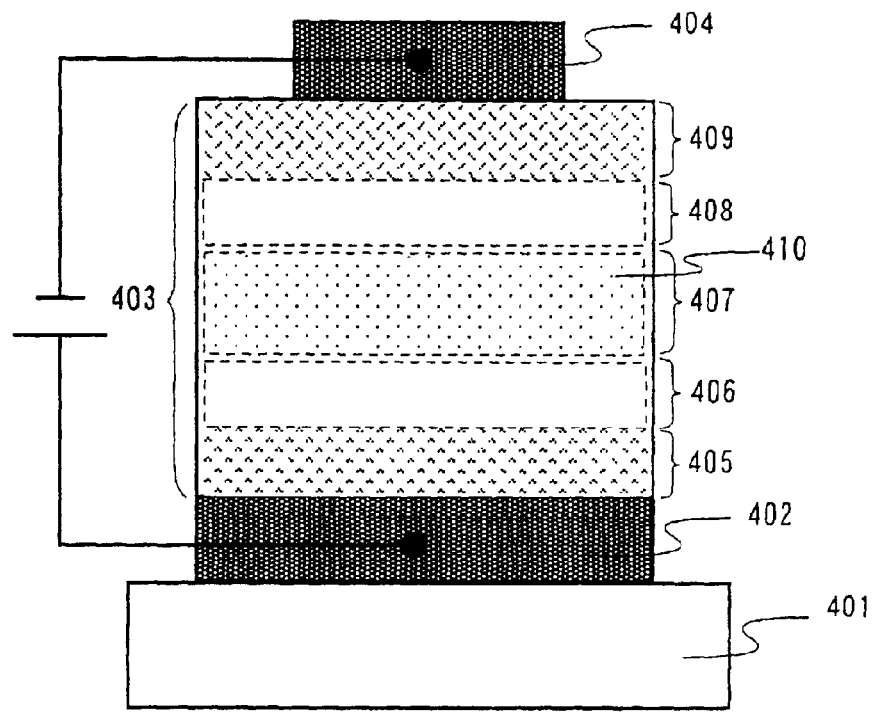
FIGS. 7A and 7B are diagrams showing structures of an organic light emitting element.
Figure 7B:
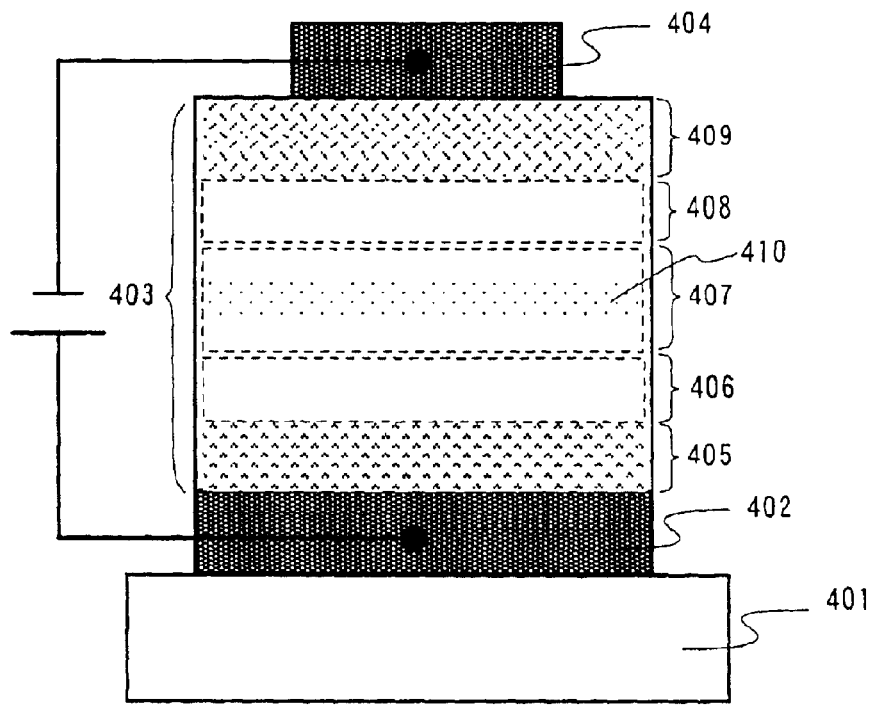

A specific example of an organic light emitting element in which a hole injecting region made from a hole injecting material is inserted between the anode 402 and the organic compound film 403 is shown in this embodiment for the organic light emitting elements of FIG. 7A.

First, the glass substrate 401 on which a film is formed from ITO by sputtering to a thickness on the order of 100 nm and the anode 402 is formed is prepared. The glass substrate 401 having the anode 402 is then conveyed to the inside of a vacuum chamber like that shown in FIGS. 9A and 9B. Five evaporation sources are necessary in this embodiment in order to evaporate five types of materials (four of the materials are organic compounds, and one is a metal that becomes a cathode).

The hole injecting material CuPc is evaporated for 20 nm first, and when the 20 nm thickness of CuPc evaporation is completed, evaporation of the hole transporting material α-NPD at an evaporation rate of 3 Å/sec is started without creating an interval. The reason that an interval is not formed is in order to prevent the formation of an impurity layer, as discussed above.

After forming the hole transporting region 405 composed of only α-NPD with a thickness of 20 nm, the shutter to the electron transporting material $Alq_3$ evaporation source is gradually opened while the evaporation rate of α-NPD remains fixed at 3 Å/sec. The first concentration change region 406 having a concentration gradient is thus formed having a thickness on the order of 10 nm. The evaporation rate of $Alq_3$ is regulated so as to become 3 Å/sec when a thickness of 10 nm is reached for the first concentration change region 406.

Next, the evaporation rate of $Alq_3$ is fixed at 3 Å/sec so that the evaporation rate ratio between α-NPD and $Alq_3$ becomes 1:1, and the mixture region 407 is formed by co-evaporation. The fluorescent pigment N,N'-dimethyl quinacridon (hereafter referred to as "MQd") is added at the same time as the light emitting material 410. The evaporation rate of MQd is controlled so that the proportion of MQd becomes on the order of 1 wt % of the total.

Evaporation of MQd is stopped after the mixture region 407 reaches a thickness of 30 nm, and the shutter to the α-NPD evaporation source is gradually closed with the evaporation rate of $Alq_3$ fixed at 3 Å/sec. The second concentration change region 408 having a concentration gradient is thus formed having a thickness on the order of 10 nm. Evaporation of α-NPD is stopped when the second concentration change region 408 has reached a thickness of 10 nm.

In addition, the electron transporting region 409 can be formed by continuing to evaporate only $Alq_3$. Its thickness is set to 40 nm. Lastly, an organic light emitting element that emits green color light originated from MQd is obtained by evaporating an Al:Li alloy to a thickness on the order of 150 nm as the cathode.

Embodiment 2

Figure 8A:
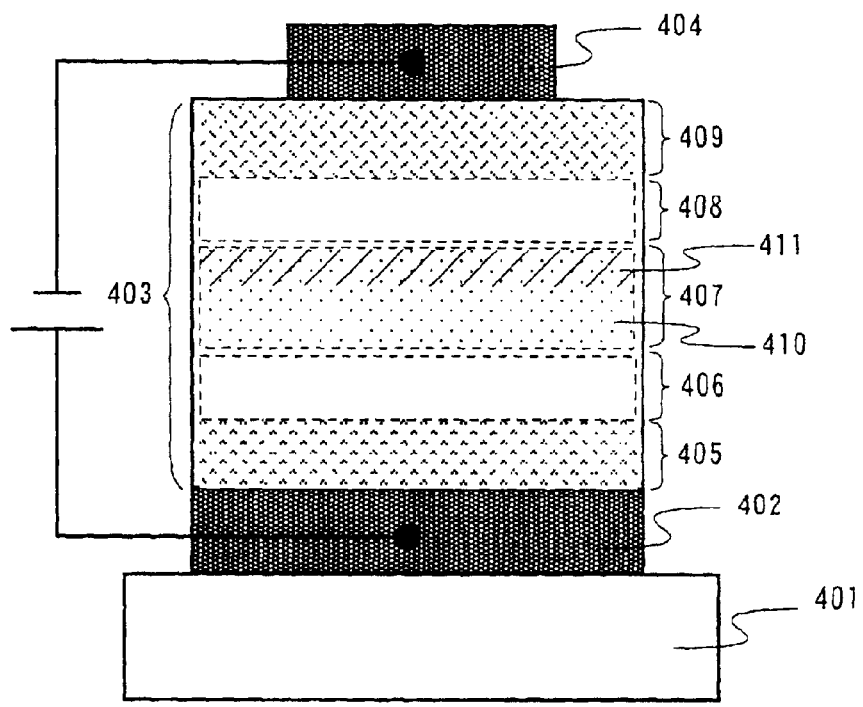
FIGS. 8A and 8B are diagrams showing structures of an organic light emitting element.
Figure 8B:
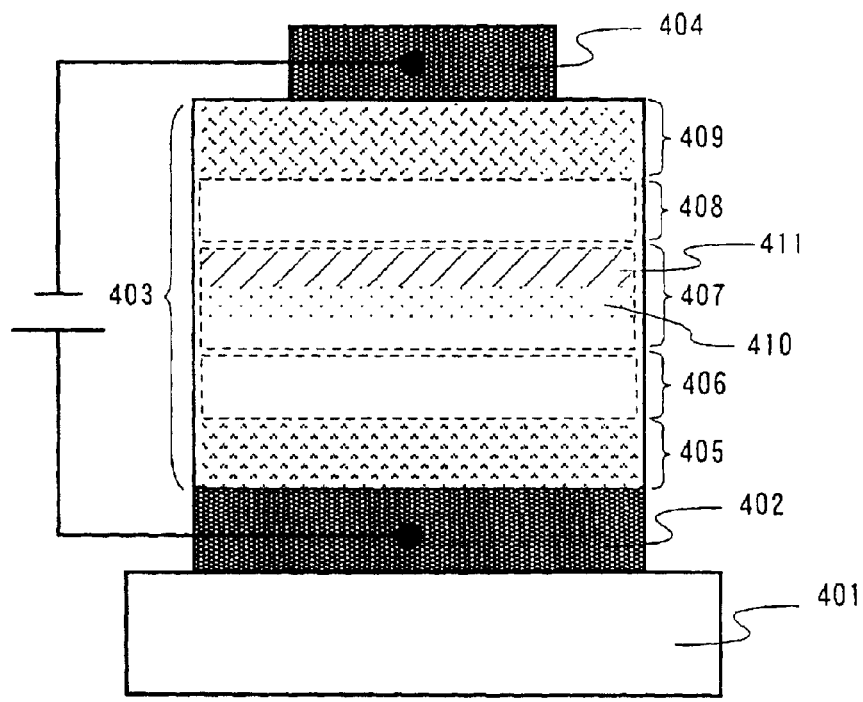

A specific example of the organic light emitting element shown in FIG. 8B is shown in this embodiment.

First, the glass substrate 401 on which a film is formed from ITO by sputtering to a thickness on the order of 100 nm and the anode 402 is formed is prepared. The glass substrate 401 having the anode 402 is then conveyed to the inside of a vacuum chamber like that shown in FIGS. 9A and 9B. Five evaporation sources are necessary in this embodiment in order to evaporate five types of materials (four of the materials are organic compounds, and one is a metal that becomes a cathode).

After forming the hole transporting region 405 to a thickness of 30 nm only from the hole transporting material MTDATA (evaporation rate of 3 Å/sec), the shutter to the MTDATA evaporation source is gradually closed, while the shutter to an evaporation source of the electron transporting material PBD is gradually opened. The first concentration change region 406 with a thickness on the order of 10 nm having a concentration gradient is thus formed. The evaporation rate of MTDATA is regulated so as to be 1 Å/sec, and the evaporation rate of PBD is regulated so as to be 4 Å/sec, once the first concentration change region 406 has reached a thickness of 10 nm.

Next, with the evaporation rates of MTDATA and PBD fixed at 1 Å/sec and 4 Å/sec, respectively, so as to form an evaporation rate ratio of 1:4 for MTDATA and PBD, the mixture region 407 is formed with a thickness of 30 nm by co-evaporation. The fluorescent pigment perylene is added as the light emitting material 410 to the intermediate 10 nm of the mixture region 407 (namely, between the 10 and 20 nm levels of the 30 nm thick mixture region). The addition of perylene is implemented such that the ratio of perylene to the entire weight is on the order of 5 wt %. Further, BCP is added as the blocking material 411 to the final 10 nm of the mixture region 407 (namely, between the 20 and 30 nm levels of the 30 nm thick mixture region). The addition of BCP is performed such that the evaporation rate ratio becomes MTDATA:PBD:BCP=1:4:5 (in other words, BCP is evaporated at a rate of 5 Å/sec).

Evaporation of BCP is stopped after the mixture region 407 reaches a thickness of 30 nm, and the shutter of the MTDATA evaporation source is gradually closed while the evaporation rate of PBD is fixed at 4 Å/sec. The second concentration change region 408 having a concentration gradient is thus formed with a thickness on the order of 10 nm. Evaporation of MTDATA is regulated so as to be complete when the second concentration change region 408 reaches 10 nm.

In addition, the electron transporting region 409 is formed by continuing to evaporate only PBD. The thickness is made to be 30 nm. Lastly, an organic light emitting element that emits blue color light originated from perylene is obtained by evaporating an Al:Li alloy as the cathode to a thickness on the order of 150 nm.

Embodiment 3

Figure 10:
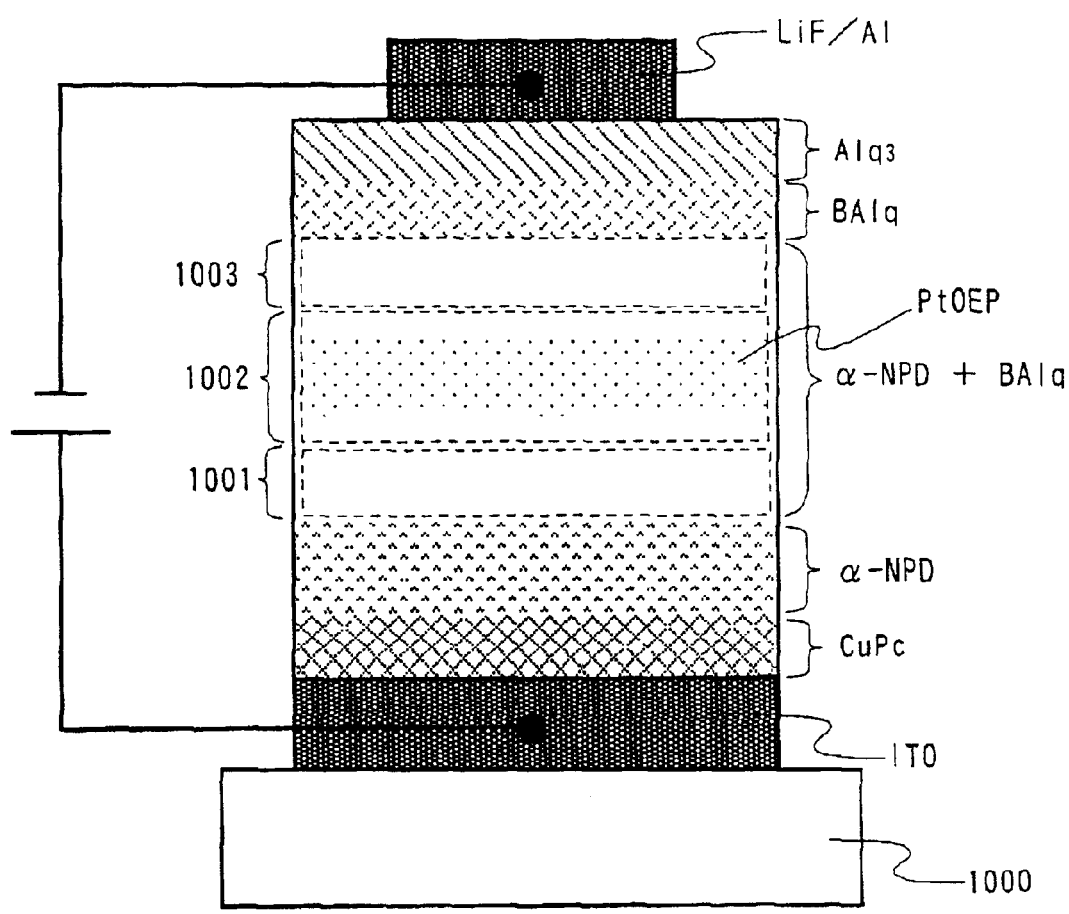
FIG. 10 is a diagram showing a structure of an organic light emitting element.

A specific example in which a hole injecting region made from a hole injecting material is inserted between the anode 402 and the organic compound film 403, an electron injecting region made from an electron injecting material is respectively inserted between the cathode 404 and the organic compound film 403, and a triplet light emitting material is applied as the light emitting material in the organic light emitting element is discussed in this embodiment. The element structure is shown in FIG. 10.

First, the glass substrate 1000 on which a film is formed from ITO by sputtering to a thickness on the order of 100 nm and the an ITO is formed is prepared. The glass substrate having the ITO is then conveyed to the inside of a vacuum chamber like that shown in FIGS. 9A and 9B. Seven evaporation sources are necessary in this embodiment in order to evaporate seven types of materials (five of the materials are organic compounds, and two are inorganic compounds that become cathodes).

The hole injecting material CuPc is evaporated for 20 nm first, and when a 20 nm thickness of CuPc evaporation is completed, evaporation of the hole transporting material α-NPD at an evaporation rate of 3 Å/sec is started without creating an interval. The reason that an interval is not formed is in order to prevent the formation of an impurity layer, as discussed above.

After forming the hole transporting region composed of only α-NPD with a thickness of 20 nm, the shutter of the electron transporting material BAlq evaporation source is gradually opened while the evaporation rate of α-NPD remains fixed at 3 Å/sec. The first concentration change region 1001 having a concentration gradient is thus formed having a thickness on the order of 10 nm. The evaporation rate of BAlq is regulated so as to become 3 Å/sec when a thickness of 10 nm is reached for the first concentration change region.

Next, with the evaporation rate of BAlq fixed at 3 Å/sec, the mixture region 1002 is formed with a thickness of 20 nm by co-evaporating α-NPD and BAlq such that their evaporation rate ratio becomes 1:1. The triplet light emitting material PtOEP is added as the light emitting material to the intermediate 10 nm of the mixture region (namely, between the 5 and 15 nm levels of the 20 nm mixture region). The proportion is set such that PtOEP becomes on the order of 6 wt % of the total weight.

The shutter of the evaporation source of α-NPD is gradually closed after the mixture region reaches a thickness of 20 nm, while the evaporation rate of BAlq remains fixed at 3 Å/sec. The second concentration change region 1003 with a thickness on the order of 10 nm having a concentration gradient is thus formed. Evaporation of α-NPD is regulated so as to stop when the second concentration change region reaches a thickness of 10 nm.

In addition, the electron transporting region is formed by continuing to evaporate only BAlq. Its thickness is set to 10 nm. Evaporation of the electron injecting material Alq$_3$ is started at the same time as evaporation of BAlq is complete, without forming an interval, and a thickness on the order of 30 nm is evaporated. The reason that an interval is not formed is in order to prevent the formation of an impurity layer, as discussed above.

The cathode is formed lastly by evaporating LiF to a thickness on the order of 1 nm, and aluminum to a thickness on the order of 150 nm, and a triplet light emitting element that emits red color light originated from PtOEP is thus obtained.

Embodiment 4

This embodiment describes a light emitting device that includes an organic light emitting element according to the present invention. FIG. 11 is sectional view of an active matrix light emitting device that uses an organic light emitting element of the present invention.

A thin film transistor (hereinafter referred to as TFT) is used here as an active element, but the active element may be a MOS transistor. The TFT shown as an example is a top gate TFT (planar TFT, to be specific), but a bottom gate TFT (typically a reverse stagger TFT) may be used instead.

Figure 11A:
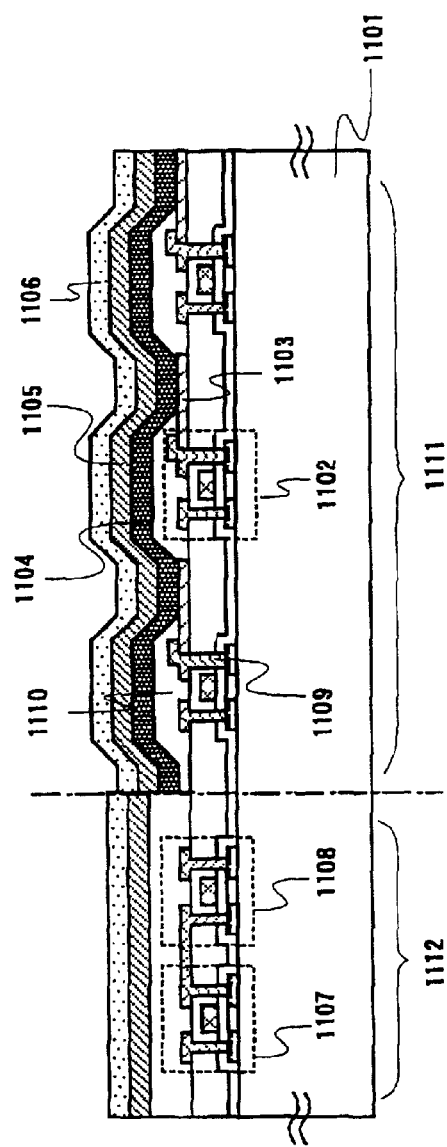
FIGS. 11A and 11B are diagrams showing cross sectional structures of a light emitting device.

In FIG. 11A, 1101 denotes a substrate. The substrate used here can transmit visible light. Specifically, a glass substrate, a quartz substrate, a crystal glass substrate, or a plastic substrate (including a plastic film) can be used. The substrate 1101 refers to the substrate plus an insulating film formed on the surface of the substrate.

On the substrate 1101, a pixel portion 1111 and a driver circuit 1112 are provided. The pixel portion 1111 will be described first.

The pixel portion 1111 is a region for displaying an image. A plurality of pixels are placed on the substrate, and each pixel is provided with a TFT 1102 for controlling a current flowing in the organic light emitting element (hereinafter referred to as current controlling TFT) 1102, a pixel electrode (anode) 1103, an organic compound layer 1104, and a cathode 1105. Although only the current controlling TFT is shown in FIG. 11a, each pixel has a TFT for controlling a voltage applied to a gate of the current controlling TFT (hereinafter referred to as switching TFT).

The current controlling TFT 1102 here is preferably a p-channel TFT. Though an n-channel TFT may be used instead, a p-channel TFT as the current controlling TFT is more advantageous in reducing current consumption if the current controlling TFT is connected to the anode of the organic light emitting element as shown in FIG. 11. Note that, the switching TFT may be formed by either an n-channel TFT or a p-channel TFT.

A drain of the current controlling TFT 1102 is electrically connected to the pixel electrode 1103. In this embodiment, a conductive material having a work function of 4.5 to 5.5 eV is used as the material of the pixel electrode 1103, and therefore the pixel electrode 1103 functions as the anode of the organic light emitting element. A light-transmissive material, typically, indium oxide, tin oxide, zinc oxide, or a compound of these (ITO, for example), is used for the pixel electrode 1103. On the pixel electrode 1103, the organic compound layer 1104 is formed.

On the organic compound film 1104, the cathode 1105 is provided. The material of the cathode 1105 is desirably a conductive material having a work function of 2.5 to 3.5 eV. Typically, the cathode 1105 is formed from a conductive film containing an alkaline metal element or an alkaline-earth metal element, or from a conductive film containing aluminum, or from a laminate obtained by layering an aluminum or silver film on one of the above conductive films.

A layer composed of the pixel electrode 1103, the organic compound film 1104, and the cathode 1105 is covered with a protective film 1106. The protective film 1106 is provided to protect the organic light emitting element from oxygen and moisture. Materials usable for the protective film 1106 include silicon nitride, silicon oxynitride, aluminum oxide, tantalum oxide, and carbon (specifically, diamond-like carbon).

Next, the driver circuit 1112 will be described. The driver circuit 1112 includes a region for controlling timing of signals (gate signals and data signals) to be sent to the pixel portion 1111, and may include a shift register, a buffer, and a latch, as well as an analog switch (transfer gate) or level shifter. In FIG. 11A, the basic unit of these circuits is a CMOS circuit composed of an n-channel TFT 1107 and a p-channel TFT 1108.

Known circuit structures can be applied to the shift register, the buffer, the latch, and the analog switch (transfer gate) or level shifter. Although the pixel portion 1111 and the driver circuit 1112 are provided on the same substrate in FIG. 11A, IC or LSI may be electrically connected to the substrate instead of placing the driver circuit 1112 on the substrate.

The pixel electrode (anode) 1103 is electrically connected to the current controlling TFT 1102 in FIG. 11A but the cathode may be connected to the current controlling TFT instead. In this case, the pixel electrode is formed from the material of the cathode 1105 whereas the cathode is formed from the material of the pixel electrode (anode) 1103. The current controlling TFT in this case is preferably an n-channel TFT.

The light emitting device shown in FIG. 11A is manufactured by a process in which formation of the pixel electrode 1103 precedes formation of a wiring line 1109. However, this process could roughen the surface of the pixel electrode 1103. The roughened surface of the pixel electrode 1103 may degrade characteristic of the organic light emitting element since it is a current-driven type element.

Figure 11B:
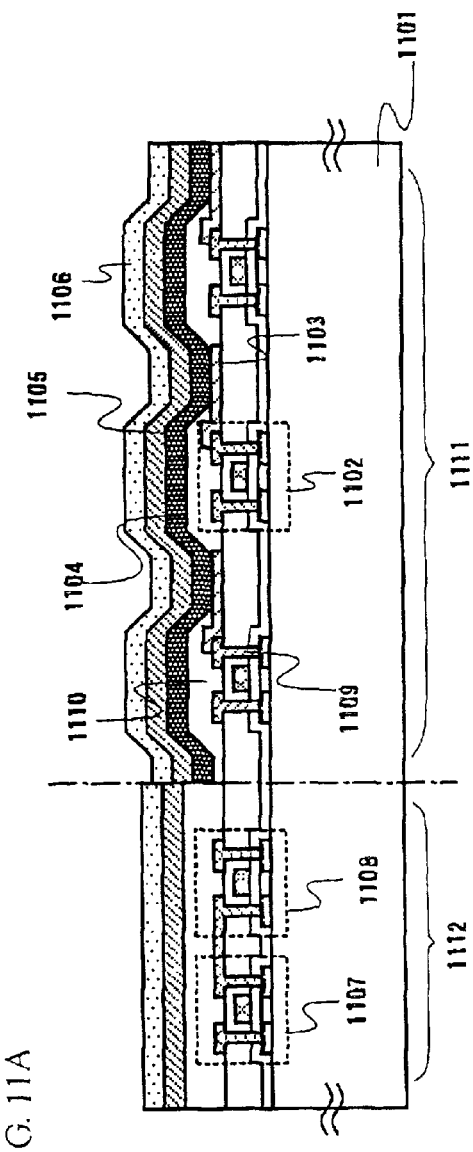

As a modification of FIG. 11A, the pixel electrode 1103 is formed after forming the wiring line 1109 to obtain a light emitting device shown in FIG. 11B. In this case, injection of current from the pixel electrode 1103 can be improved compared to the structure of FIG. 11A.

In FIGS. 11A and 11B, a forward-tapered bank structure 1110 separates the pixels placed in the pixel portions 1111 from one another. If this bank structure is reverse-tapered, a contact between the bank structure and the pixel electrode can be avoided. An example thereof is shown in FIG. 12.

Figure 12:
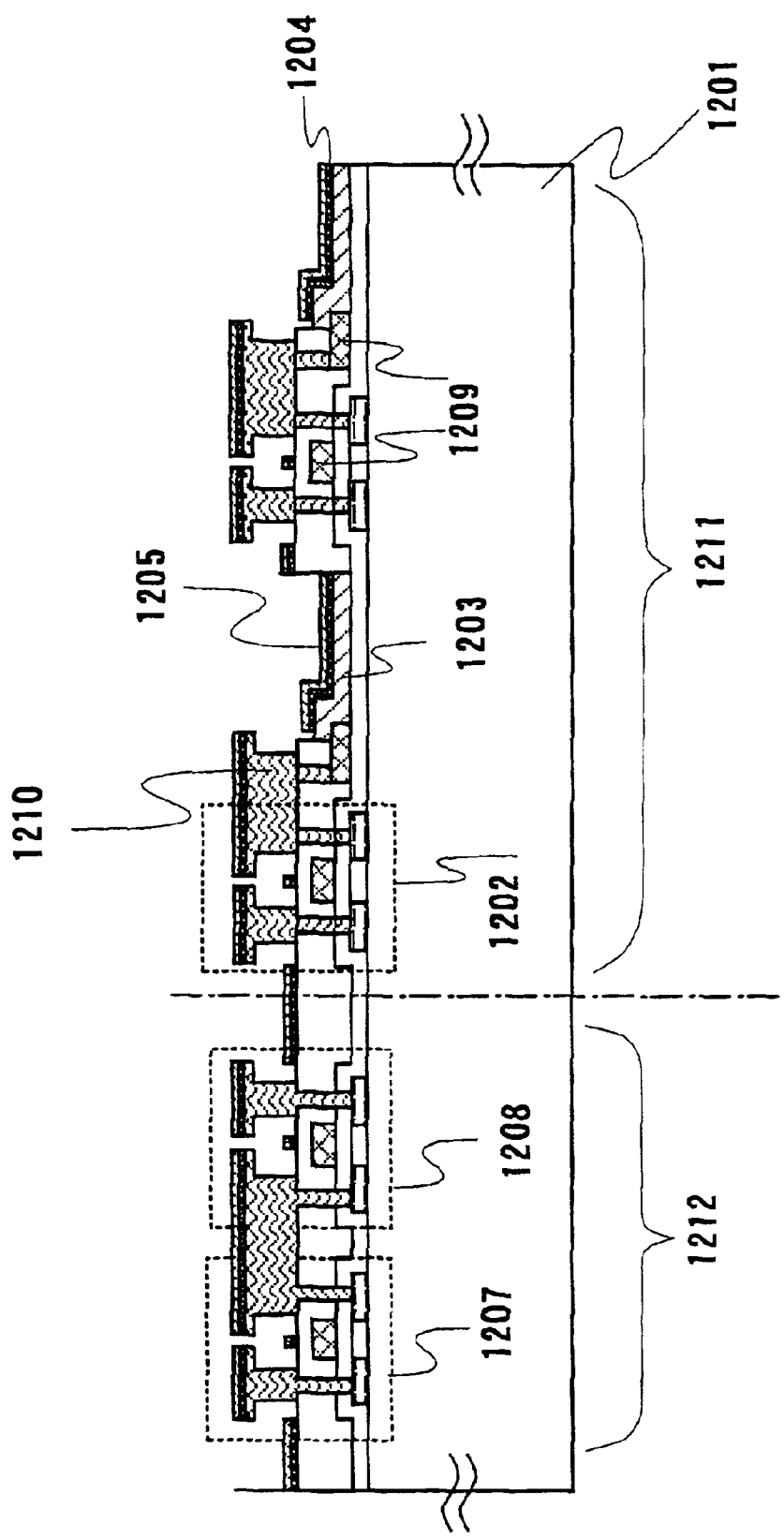
FIG. 12 is a diagram showing a cross sectional structure of a light emitting device.

In FIG. 12, a wiring line also serves as a separation portion, forming a wiring line and separation portion 1210. The shape of the wiring line and separation portion 1210 shown in FIG. 12 (namely, a structure with eaves) is obtained by layering a metal that constitutes the wiring line and a material lower in etch rate than the metal (a metal nitride, for example) and then etching the laminate. This shape can prevent short circuit between a cathode 1205 and a pixel electrode 1203 or the wiring line. Unlike a usual active matrix light emitting device, the cathode 1205 on the pixel is striped in the device of FIG. 12 (similar to a cathode in a passive matrix device).

Figure 13A:
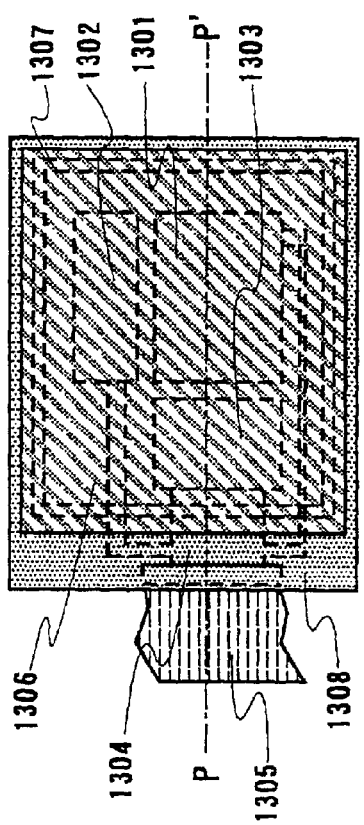
FIGS. 13A and 13B are diagrams showing an upper surface structure and a cross sectional structure, respectively, of a light emitting device.
Figure 13B:
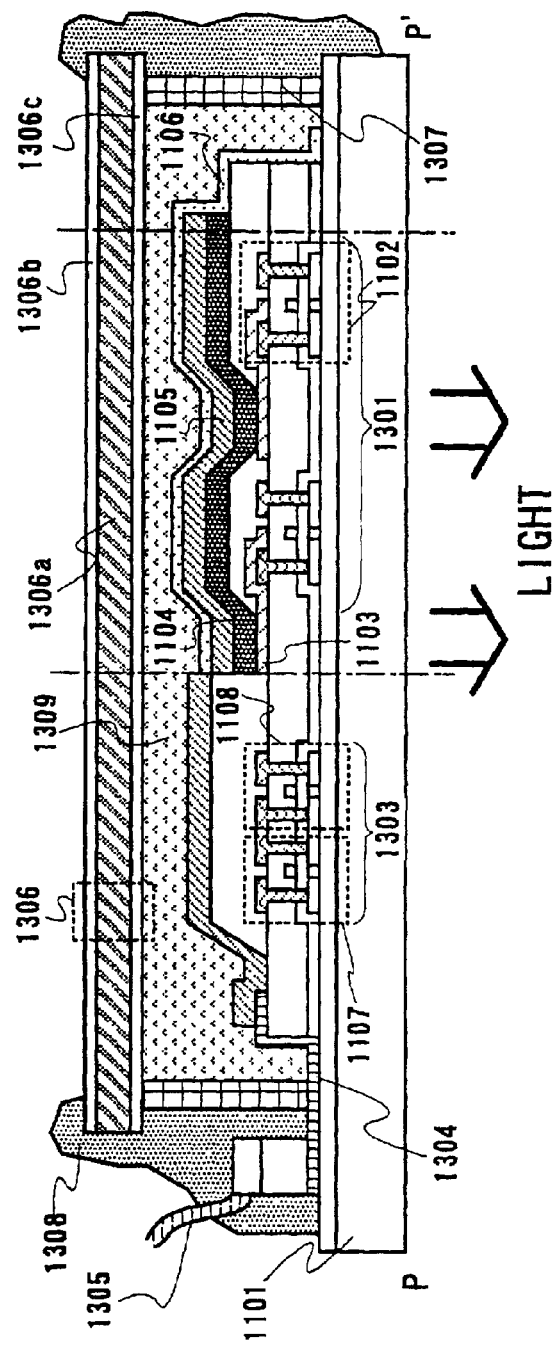

FIGS. 13A and 13B show the exterior of the active matrix light emitting device illustrated in FIG. 11B. FIG. 13A is a top view thereof and FIG. 13B is a sectional view taken along the line P–P' of FIG. 13A. The symbols in FIG. 11 are used in FIG. 13.

In FIG. 13A, 1301 denotes a pixel portion, 1302 denotes a gate signal side driver circuit, and 1303 denotes a data signal side driver circuit. Signals to be sent to the gate signal side driver circuit 1302 and the data signal side driver circuit 1303 are inputted from a TAB (tape automated bonding) tape 1305 through an input wiring line 1304. Though not shown in the drawing, the TAB tape 1305 may be replaced by a TCP (tape carrier package) that is obtained by providing a TAB tape with an IC (integrated circuit).

Denoted by 1306 is the cover member that is provided in an upper part of the organic light emitting device shown in FIG. 11B, and is bonded with a seal member 1307 formed of a resin. The cover member 1306 may be any material as long as it does not transmit oxygen and water. In this embodiment, as shown in FIG. 13B, the cover member 1306 is composed of a plastic member 1306a and carbon films (specifically, diamond-like carbon films) 1306b and 1306c that are formed on the front and back of the plastic member 1306a, respectively.

As shown in FIG. 13B, the seal member 1307 is covered with a sealing member 1308 made of a resin so that the organic light emitting element is completely sealed in an airtight space 1309. The airtight space 1309 is filled with inert gas (typically, nitrogen gas or rare gas), a resin, or inert liquid (for example, liquid fluorocarbon typical example of which is perfluoro alkane). It is also effective to put an absorbent or deoxidant in the space.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 5

Figure 14:
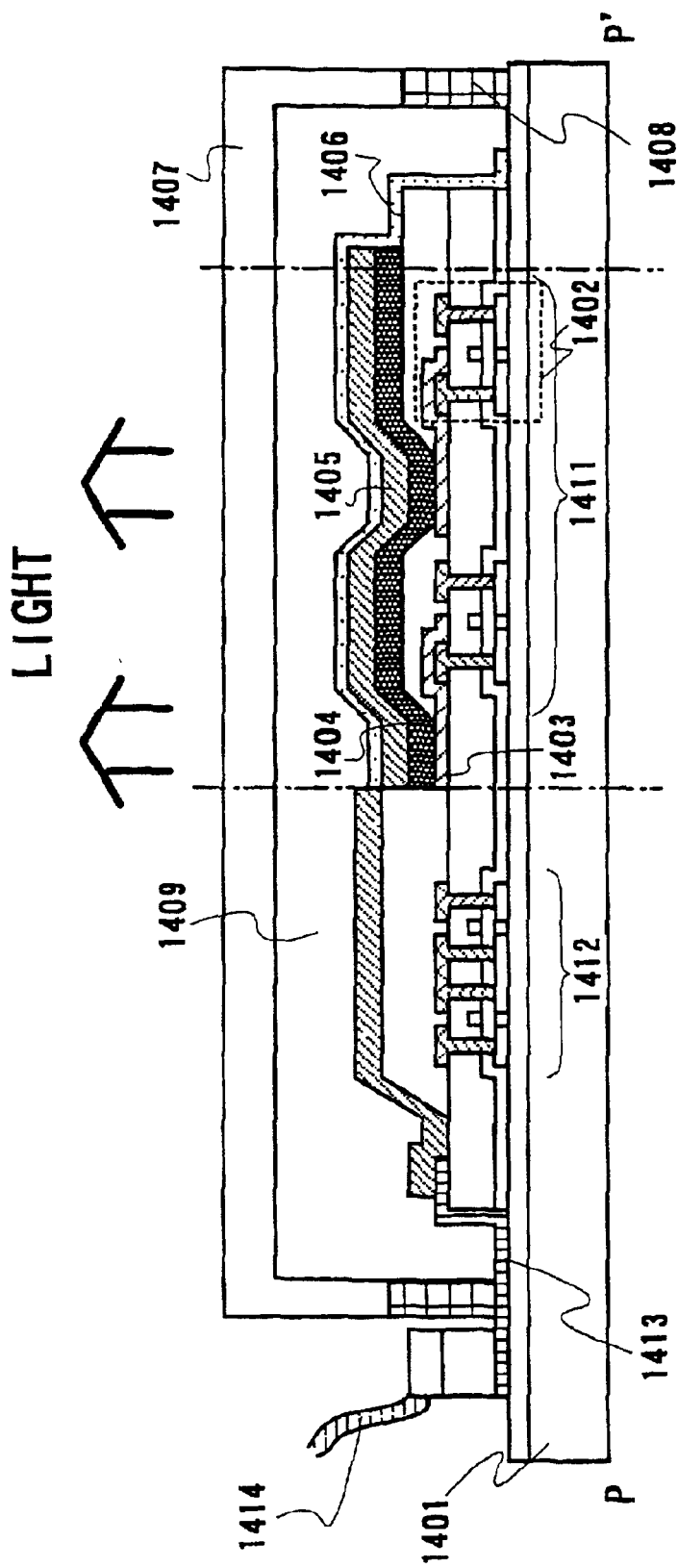
FIG. 14 is a diagram showing a cross sectional structure of a light emitting device.

This embodiment shows an active matrix light emitting device as an example of a light emitting device that includes an organic light emitting element according to the present invention. Unlike Embodiment 4, in the light emitting device of this embodiment, light is taken out from the opposite side of a substrate on which an active element is formed (hereinafter referred to as upward emission). FIG. 14 is a sectional view thereof.

A thin film transistor (hereinafter referred to as TFT) is used here as the active element, but the active element may be a MOS transistor. The TFT shown as an example is a top gate TFT (planar TFT, to be specific), but a bottom gate TFT (typically a reverse stagger TFT) may be used instead.

A substrate 1401, a current controlling TFT 1402 that is formed in a pixel portion, and a driver circuit 1412 of this embodiment have the same structure as those of Embodiment 4.

A first electrode 1403, which is connected to a drain of the current controlling TFT 1402, is used as an anode in this embodiment, and therefore is formed preferably from a conductive material having a large work function. Typical examples of the conductive material include metals such as nickel, palladium, tungsten, gold, and silver. In this embodiment, the first electrode 1403 desirably does not transmit light. More desirably, the electrode is formed from a material that is highly reflective of light.

On the first electrode 1403, an organic compound film 1404 is formed. Provided on the organic compound film 1404 is a second electrode 1405, which serves as a cathode in this embodiment. Accordingly, the material of the second electrode 1405 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. However, being light-transmissive is indispensable for the material of the second electrode 1405. Therefore, when used for the second electrode, the metal is preferably formed into a very thin film about 20 nm in thickness.

A layer composed of the first electrode 1403, the organic compound film 1404, and the second electrode 1405, are covered with a protective film 1406. The protective film 1406 is provided to protect the organic light emitting element from oxygen and moisture. In this embodiment, any material can be used for the protective film as long as it transmits light.

The first electrode (anode) 1403 is electrically connected to the current controlling TFT 1402 in FIG. 14 but the cathode may be connected to the current controlling TFT instead. In this case, the first electrode is formed from the material of the cathode whereas the second electrode is formed from the material of the anode. The current controlling TFT in this case is preferably an n-channel TFT.

Denoted by 1407 is a cover member and is bonded with a seal member 1408 formed of a resin. The cover member 1407 may be any material as long as it transmits light but not oxygen and water. In this embodiment, glass is used. An airtight space 1409 is filled with inert gas (typically, nitrogen gas or rare gas), a resin, or inert liquid (for example, liquid fluorocarbon typical example of which is perfluoro alkane). It is also effective to put an absorbent or deoxidant in the space.

Signals to be sent to the gate signal side driver circuit and the data signal side driver circuit are inputted from a TAB (tape automated bonding) tape 1414 through an input wiring line 1413. Though not shown in the drawing, the TAB tape 1414 may be replaced by a TCP (tape carrier package) that is obtained by providing a TAB tape with an IC (integrated circuit).

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 6

Figure 15A:
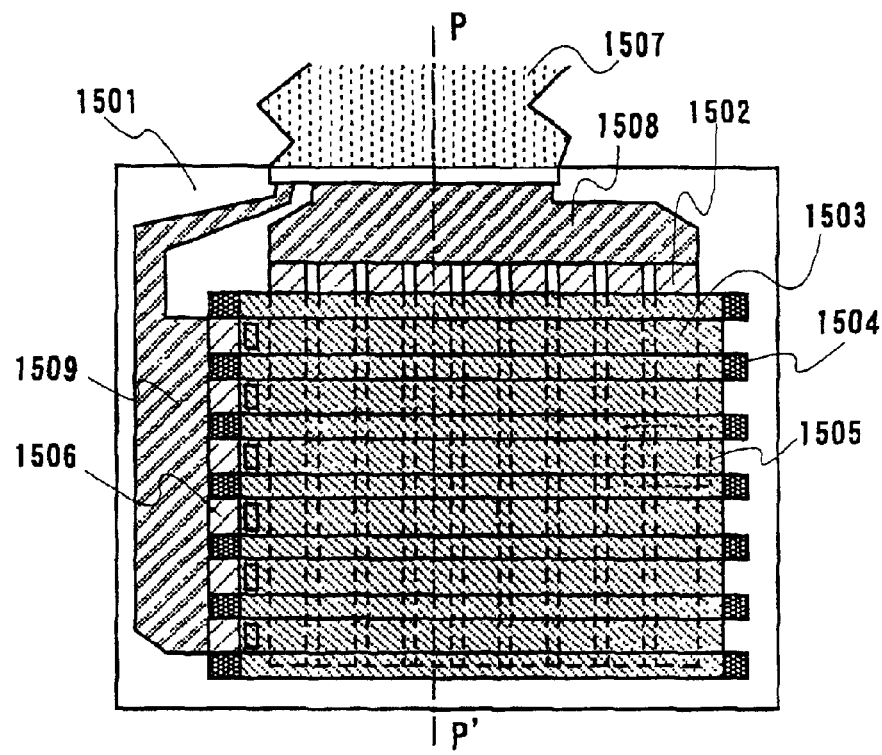
FIGS. 15A to 15C are diagrams showing an upper surface structure, and cross sectional structures, respectively, of a light emitting device.
Figure 15B:
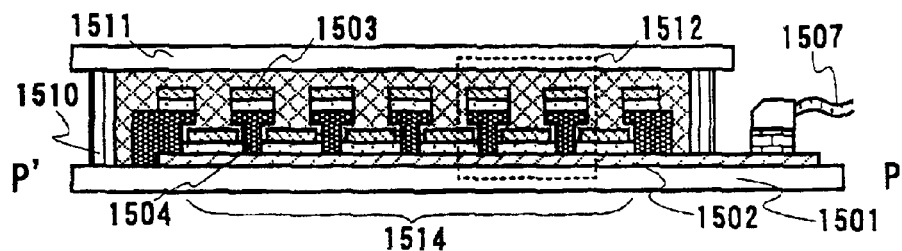

This embodiment shows a passive matrix light emitting device as an example of a light emitting device that includes an organic light emitting element disclosed in the present invention. FIG. 15A is a top view thereof and FIG. 15B is a sectional view taken along the line P-P' of FIG. 15A.

In FIG. 15A, denoted by 1501 is a substrate, which is formed of a plastic material here. The plastic material, which can be used, is a plate or film of polyimide, polyamide, an acrylic resin, an epoxy resin, PES (polyethylene sulfile), PC (polycarbonate), PET (polyethylene terephthalate), or PEN (polyethylene naphthalate).

1502 denotes scanning lines (anodes) formed from a conductive oxide film. In this embodiment, the conductive oxide film is obtained by doping zinc oxide with gallium oxide. 1503 denotes data lines (cathodes) formed from a metal film, a bismuth film, in this embodiment. 1504 denotes banks formed of an acrylic resin. The banks function as partition walls that separate the data lines 1503 from one another. The scanning lines 1502 and the data lines 1503 respectively form stripe patterns and the patterns cross each other at right angles. Though not shown in FIG. 15A, an organic compound film is sandwiched between the scanning lines 1502 and the data lines 1503 and intersection portions 1505 serve as pixels.

The scanning lines 1502 and the data lines 1503 are connected to an external driver circuit through a TAB tape 1507. 1508 denotes a group of wiring lines comprised of a mass of the scanning lines 1502. 1509 denotes a group of wiring lines comprised of a mass of connection wiring lines 1506 that are connected to the data lines 1503. Though not shown, the TAB tape 1507 may be replaced by TCP that is obtained by providing a TAB tape with an IC.

In FIG. 15B, 1510 denotes a seal member and 1511 denotes a cover member that is bonded to a plastic member 1501 with the seal member 1510. A photo-curable resin can be used for the seal member 1510. A preferable material of the seal member is one which allows little gas leakage and which absorbs little moisture. The cover member is preferably made from the same material as the substrate 1501, and glass (including quartz glass) or plastic can be used. Here, a plastic material is used for the cover member.

Figure 15C:
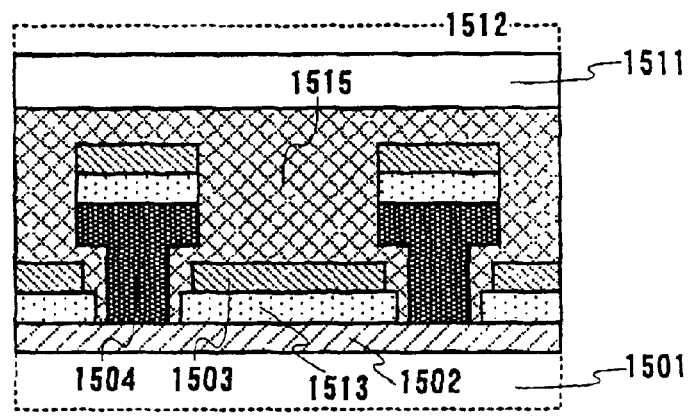

FIG. 15C is an enlarged view of the structure of a pixel region. 1513 denotes an organic compound film. Lower layers of the banks 1504 are narrower than upper layers and therefore the banks can physically separate the data lines 1503 from one another. A pixel portion 1514 surrounded by the seal member 1510 is shut off of the outside air by a sealing member 1515 formed of a resin. Degradation of the organic compound film is thus prevented.

In the light emitting device structured as above in accordance with the present invention, the pixel portion 1514 is composed of the scanning lines 1502, the data lines 1503, the banks 1504, and the organic compound film 1513. Therefore the light emitting device can be manufactured by a very simple process.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 7

This embodiments shows an example of attaching a printed wiring board to the light emitting device shown in Embodiment 6 to make the device into a module.

Figure 16A:
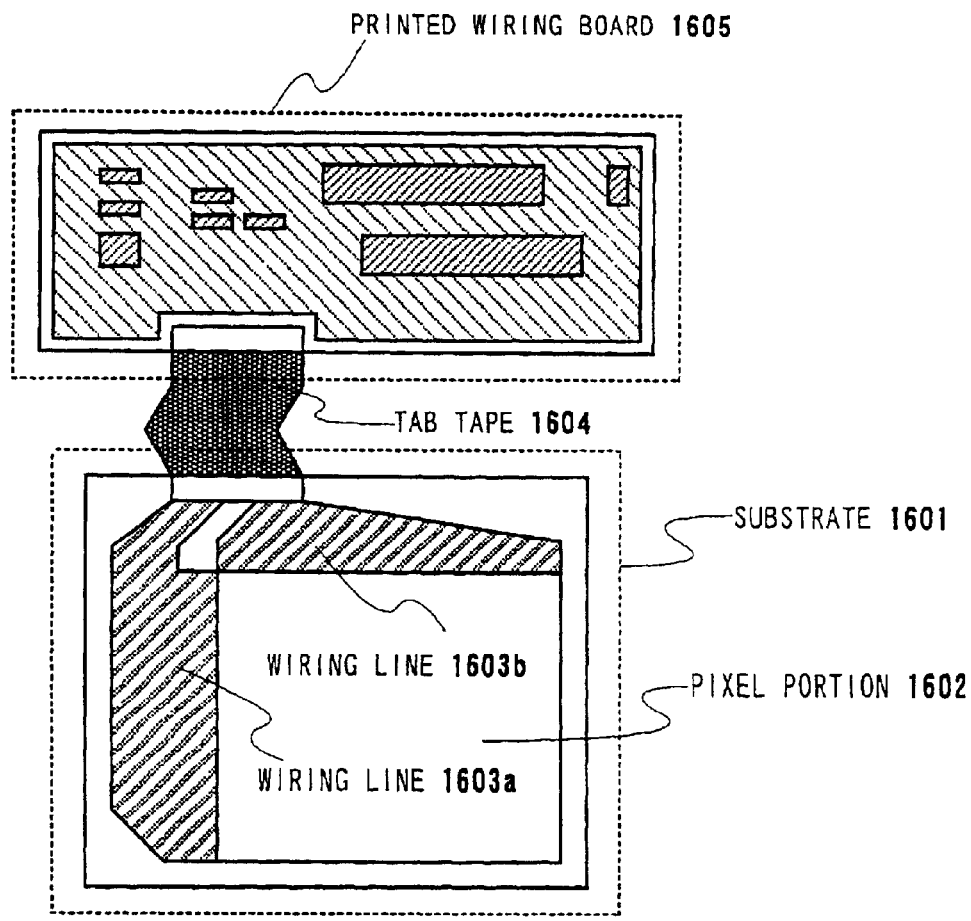
FIG. 16A and 16B are diagrams showing structures of a light emitting device.

In a module shown in FIG. 16A, a TAB tape 1604 is attached to a substrate 1601 (here including a pixel portion 1602 and wiring lines 1603*a* and 1603*b*), and a printed wiring board 1605 is attached to the substrate through the TAB tape 1604.

Figure 16B:
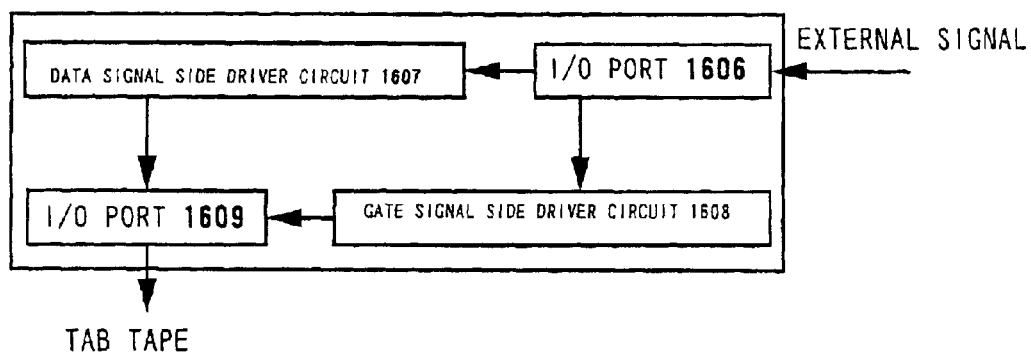

A functional block diagram of the printed wiring board 1605 is shown in FIG. 16B. An IC functioning as at least I/O ports (input or output portions) 1606 and 1609, a data signal side driver circuit 1607, and a gate signal side driver circuit 1608 are provided within the printed wiring board 1605.

In this specification, a module structured by attaching a TAB tape to a substrate with a pixel portion formed on its surface and by attaching a printed wiring board that functions as a driver circuit to the substrate through the TAB tape as above is specially named a module with external driver circuit.

Any of organic light emitting elements disclosed in the present invention can be used as the organic light emitting element included in the light emitting device of this embodiment.

Embodiment 8

This embodiment shows an example of attaching a printed wiring board to the light emitting device shown in Embodiment 4, 5, or 6 to make the device into a module.

Figure 17A:
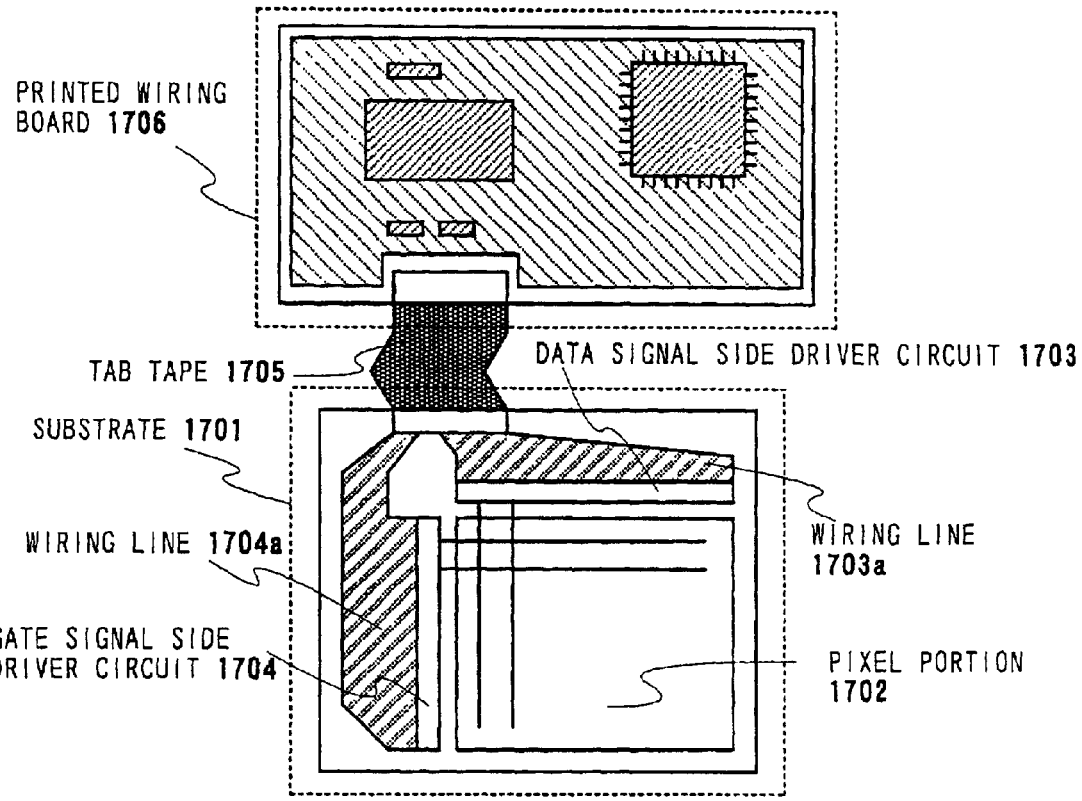
FIGS. 17A and 17B are diagrams showing structures of a light emitting device.

In a module shown in FIG. 17A, a TAB tape 1705 is attached to a substrate 1701 (here including a pixel portion 1702, a data signal side driver circuit 1703, a gate signal side driver circuit 1704, and wiring lines 1703*a* and 1704*a*), and a printed wiring board 1706 is attached to the substrate through the TAB tape 1705. A functional block diagram of the printed wiring board 1706 is shown in FIG. 17B.

Figure 17B:
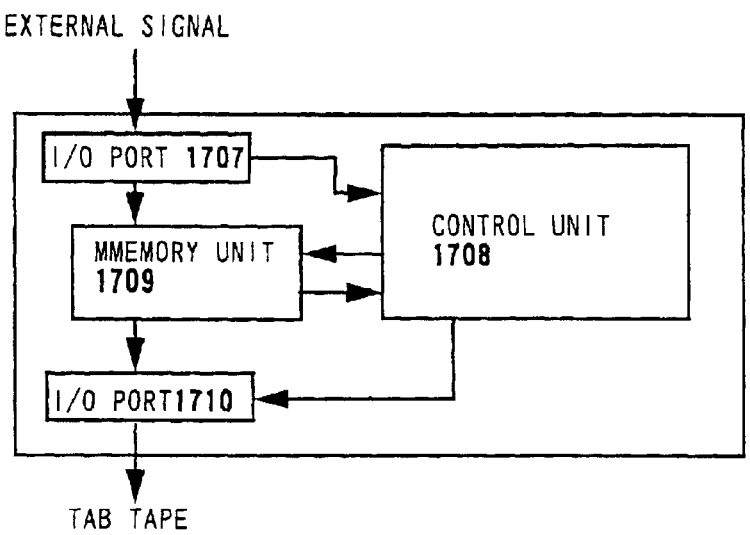

As shown in FIG. 17B, an IC functioning as at least I/O ports 1707 and 1710 and a control unit 1708 is provided within the printed wiring board 1706. A memory unit 1709 is provided here but it is not always necessary. The control unit 1708 is a portion having functions for controlling the driver circuits and correction of image data.

In this specification, a module structured by attaching a printed wiring board that has functions as a controller to a substrate on which an organic light emitting element is formed as above is specially named a module with external controller.

Any of organic light emitting elements disclosed in the present invention can be used as the organic light emitting element included in the light emitting device of this embodiment.

Embodiment 9

This embodiment shows an example of light emitting device in which a triplet light emitting element shown in Embodiment 3 is driven in accordance with digital time gray scale display. The light emitting device of this embodiment can provide uniform images in digital time gray scale display by using a light emitting from the state of triplet excitation and therefore is very useful. It should be noted that the driving method of the present invention is not limited to this embodiment and other known methods may be used.

Figure 18A:
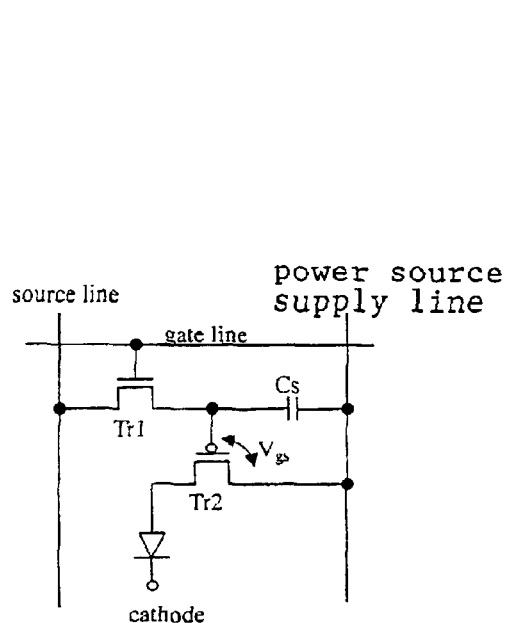
FIGS. 18A to 18C are diagrams showing structures of a light emitting device.

FIG. 18A shows the circuit structure of a pixel that uses an organic light emitting element. Tr represents a transistor and Cs represents a storage capacitor. In the circuit configuration of FIG. 18C, the source line is connected to the source of the transistor Tr1, and the gate line is connected to the gate of the transistor Tr1. Also, the power supply time is connected to the storage capacitor Cs and the source of the transistor Tr2. Since the anode of the organic light emitting, element of the present invention is connected to the drain of the transistor Tr2, the cathode is on the opposite side of the transistor Tr2 with the organic light emitting element interposed therebetween. In this circuit, when a gate line is selected, a current flows into Tr1 from a source line and a voltage corresponding to the signal is accumulated in Cs. Then a current controlled by the gate-source voltage ($V_{gs}$) of Tr2 flows into Tr2 and the organic light emitting element.

After Tr1 is selected, Tr1 is turned OFF to hold the voltage ($V_{gs}$) of Cs. Accordingly a current continues to flow in an amount dependent of $V_{gs}$.

Figure 18C:
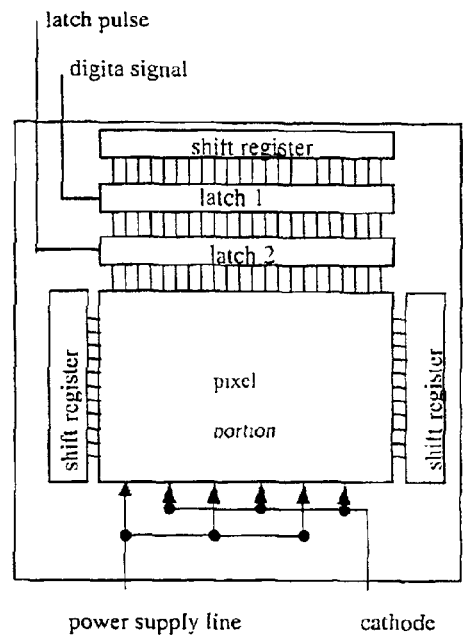
Figure 18B:
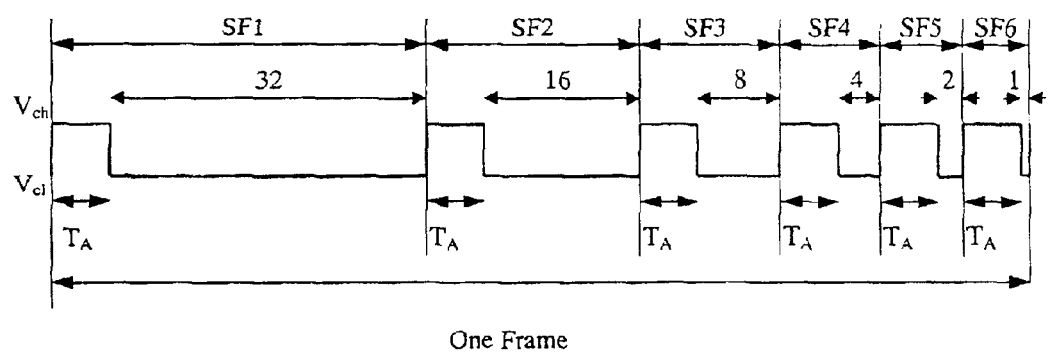

FIG. 18B shows a chart for driving this circuit in accordance with digital time gray scale display. In digital time gray scale display, one frame is divided into plural sub-frames. FIG. 18B shows 6 bit gray scale in which one frame is divided into six sub-frames. (SF1–SF6) TA is the writing time. In this case, the ratio of light emission periods of the sub-frames is 32:16:8:4:2:1 as shown in the figure.

FIG. 18C schematically shows driver circuits of TFT substrate in this embodiment. In the substrate configuration of FIG. 18C, the power supply line and the cathode as shown in FIG. 18A are connected to the pixels of the light emitting element. Also, the shift register is connected to the pixel portion in the order of from the shift register, the latch 1, the latch 2 and the pixel portion. The latch 1 is input with digital signal and image signals can be transferred to the pixel portion by the latch pulses input to the latch 2. A gate driver and a source driver are provided on the same substrate, and the pixel circuit and the drivers are designed to be digitally driven. Accordingly, fluctuation in TFT characteristic does not affect the device and the device can display uniform images.

Embodiment 10

In this embodiment, an example of an active matrix type constant-current driver circuit is described, which is driven by flowing the constant current in the organic light emitting element of the present invention. The circuit structure thereof is shown in FIG. 21.

Figure 21:
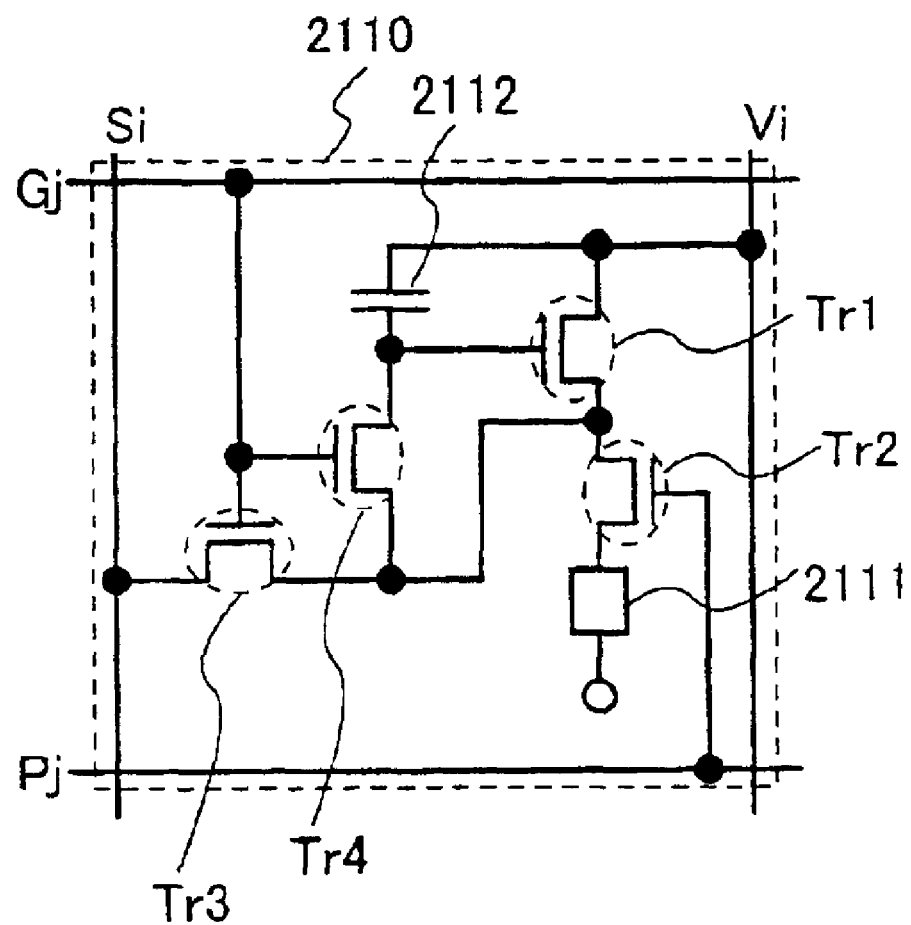
FIG. 21 is a diagram showing a structure of a light emitting device.

The pixel 2110 shown in FIG. 21 has the signal line Si, the first scanning line Gj, the second scanning line Pj and the power source line Vi. In addition, the pixel 2110 has Tr1, Tr2, Tr3, Tr4, the organic light emitting element 2111 of a mixed junction type and the retention capacitor 2112.

Both gates of Tr3 and Tr4 are connected with the first scanning line Gj. As for the source and the drain of Tr3, the one is connected with the signal line Si, the other is connected with the source of Tr2. Further, the source and the drain of Tr4, the one is connected with the source of Tr2, the other is connected to the gate of Tr1. Thus, the either of the source and the drain of Tr3 and the either of the source or the drain of Tr4 are connected with each other.

The source of Tr1 is connected with the power source line Vi, the drain is connected with the source of Tr2. The gate of Tr2 is connected to the second scanning line Pj. And, the drain of the Tr2 is connected with a pixel electrode in the organic light emitting element 2111. The organic light emitting element 2111 has the pixel electrode, the counter electrode and the organic light emitting layer provided between the pixel electrode and the counter electrode. The counter electrode of the organic light emitting element 2111 is applied constant voltage by a power source provided at the external of a light emitting panel.

Tr3 and Tr4 can adopt both n-channel type TFT and p-channel type TFT. However, the polarities of Tr3 and Tr4 are the same. Further, Tr1 can adopt both n-channel type TFT and p-channel type TFT. Tr2 can adopt both n-channel type TFT and p-channel type TFT. With respect to the polarity, in the case of the pixel electrode of the light emitting electrode and the counter electrode, the one is an anode, the other is a cathode. In the case that the Tr2 is a p-channel type TFT, it is preferable to use the anode as a pixel electrode, and the cathode as a counter electrode. On the other hand, in the case that the Tr2 is an n-channel type TFT, it is preferable to use the cathode as a pixel electrode, and the anode as a counter electrode.

The retention capacitor 2112 is formed between the gate and the source of Tr1. The retention capacitor 2112 is provided to maintain more certainly the voltage ($V_{GS}$) between the gate and the source of Tr1. However, it is not necessary always provided.

In the pixel shown in FIG. 21, the current supplied to the signal line Si is controlled at the current source in the signal line driver circuit.

By applying the above-mentioned circuit structure, the constant-current driving can be realized, by which the brightness can be kept by flowing a constant current in the organic light emitting element. The organic light emitting element having a mixture region of the present invention has a longer lifetime than that of prior organic light emitting element. The organic light emitting element is effective because longer lifetime can be realized by implementing above-mentioned constant-current driving.

Embodiment 11

The light emitting devices of the present invention, which have been described in, the embodiments above have advantages of low power consumption and long lifetime. Accordingly, electric appliances that include those light emitting devices as their display portions can operate consuming less power than conventional ones and are durable. The advantages are very useful especially for electric appliances that use batteries as power sources, such as portable equipment, because low power consumption leads directly to conveniences (batteries last longer).

The light emitting device is self-luminous to eliminate the need for back light as the one in liquid crystal displays, and has an organic compound film whose thickness is less than 1 μm. Therefore the light emitting device can be made thin and light-weight. Electric appliances that include the light emitting device as their display portions are accordingly thinner and lighter than conventional ones. This too leads directly to conveniences (lightness and compactness in carrying them around) and is very useful particularly for portable equipment and like other electric appliances. Moreover, being thin (unvoluminous) is doubtlessly useful for all of the electric appliances in terms of transportation (a large number of appliances can be transported in a mass) and installation (space-saving).

Being self-luminous, the light emitting device is characterized by having better visibility in bright places than liquid crystal display devices and wide viewing angle. Therefore electric appliances that include the light emitting device as their display portions are advantageous also in terms of easiness in viewing display.

To summarize, electric appliances that use a light emitting device of the present invention have, in addition to merits of conventional organic light emitting elements, namely, thinness/lightness and high visibility, new features of low power consumption and long lifetime, and therefore are very useful.

Figure 19A:
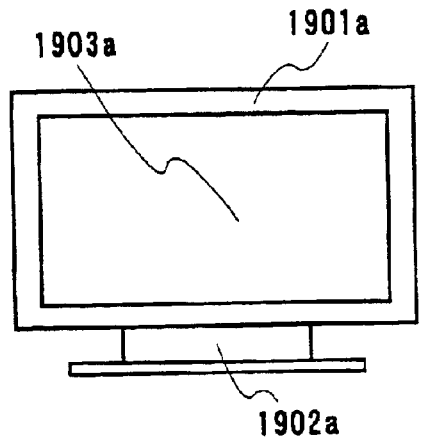
FIGS. 19A to 19F are diagrams showing specific examples of electronic equipment.

This embodiment shows examples of the electric appliances that include as display portions the light emitting device of the present invention. Specific examples thereof are shown in FIGS. 19A and 20B. Any elements disclosed in the present invention can be used for the organic light emitting element included in the electric appliance of this embodiment. The light emitting device included in the electric appliance of this embodiment can have any of the configurations illustrated in FIGS. 11 to 18.

FIG. 19A shows a display device using an organic light emitting element. The display is composed of a case 1901a, a support base 1902a, and a display portion 1903a. By using a light emitting device of the present invention as the display portion 1903a, the display can be thin and light-weight, as well as durable. Accordingly, transportation is simplified, space is saved in installation, and lifetime is long.

Figure 19B:
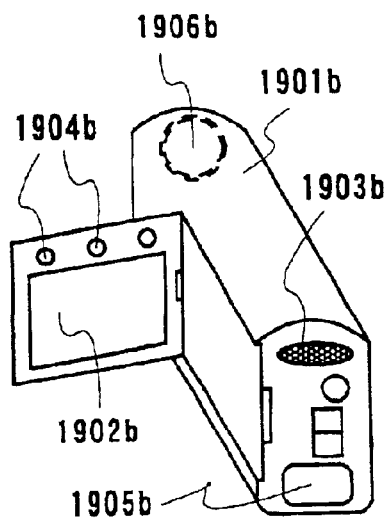

FIG. 19B shows a video camera, which is composed of a main body 1901b, a display portion 1902b, an audio input portion 1903b, operation switches 1904b, a battery 1905b, and an image receiving portion 1906b. By using a light emitting device of the present invention as the display portion 1902b, the video camera can be thin and light-weight, and consumes less power. Accordingly, battery consumption is reduced and carrying the video camera is less inconvenient.

Figure 19C:
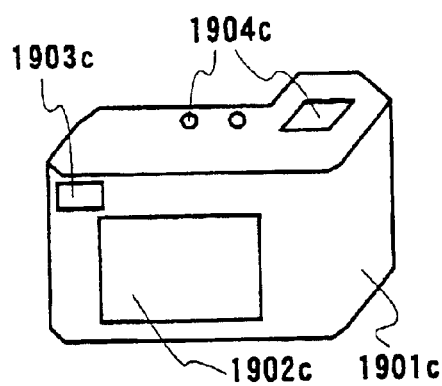

FIG. 19C shows a digital camera, which is composed of a main body 1901*c*, a display portion 1902*c*, an eye piece portion 1903*c*, and operation switches 1904*c*. By using a light emitting device of the present invention as the display portion 1902*c*, the digital camera can be thin and light-weight, and consumes less power. Accordingly, battery consumption is reduced and carrying the digital camera is less inconvenient.

Figure 19D:
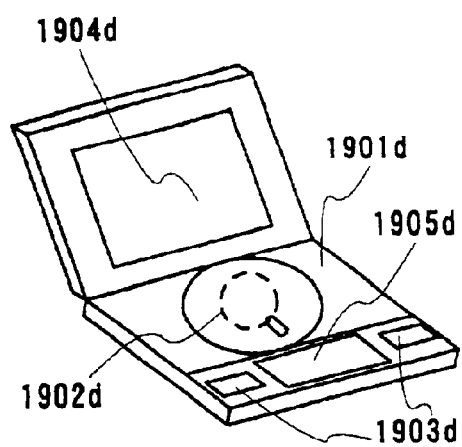

FIG. 19D shows an image reproducing device equipped with a recording medium. The device is composed of a main body 1901*d*, a recording medium (such as CD, LD, or DVD) 1902*d*, operation switches 1903*d*, a display portion (A) 1904*d*, and a display portion (B) 1905*d*. The display portion (A) 1904*d* mainly displays image information whereas the display portion (B) 1905*d* mainly displays text information. By using a light emitting device of the present invention as the display portion (A) 1904*d* and the display portion (B) 1905*d*, the image reproducing device consumes less power and can be thin and light-weight as well as durable. The image reproducing device equipped with a recording medium also includes CD players and game machines.

Figure 19E:
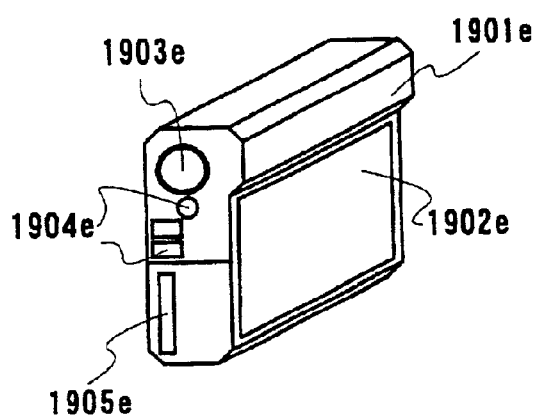

FIG. 19E shows a (portable) mobile computer, which is composed of a main body 1901*e*, a display portion 1902*e*, an image receiving portion 1903*e*, a switch 1904*e*, and a memory slot 1905*e*. By using a light emitting device of the present invention as the display portion 1902*e*, the portable computer can be thin and light-weight, and consumes less power. Accordingly, battery consumption is reduced and carrying the computer is less inconvenient. The portable computer can store information in a flash memory or a recording medium obtained by integrating non-volatile memories and can reproduce the stored information.

Figure 19F:
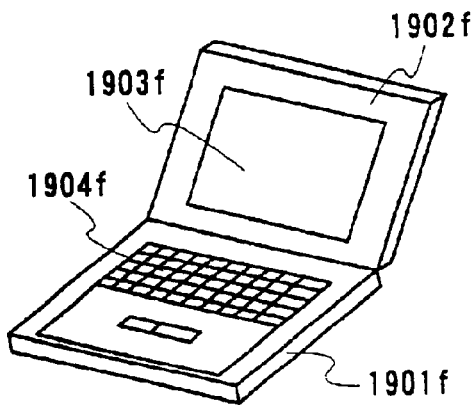

FIG. 19F shows a personal computer, which is composed of a main body 1901*f*, a case 1902*f*, a display portion 1903*f*, and a keyboard 1904*f*. By using a light emitting device of the present invention as the display portion 1903*f*, the personal computer can be thin and light-weight, and consumes less power. The light emitting device is a great merit in terms of battery consumption and lightness especially for a notebook personal computer or other personal computers that are carried around.

These electric appliances now display with increasing frequency information sent through electronic communication lines such as the Internet and radio communications such as radio wave, especially, animation information. Since organic light emitting elements have very fast response speed, the light emitting device is suitable for animation display.

Figure 20A:
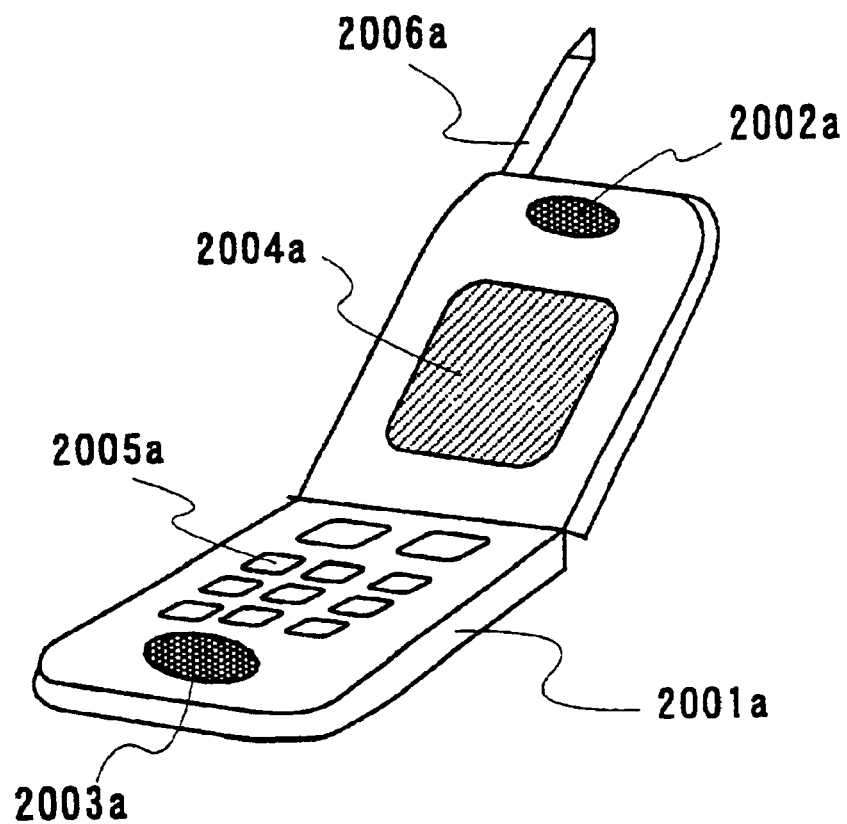
FIGS. 20A and 20B are diagrams showing specific examples of electronic equipment.
Figure 20B:
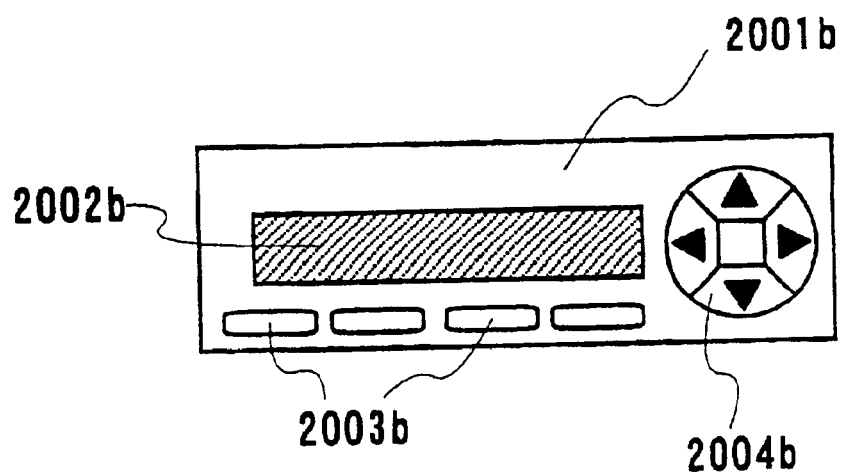

FIG. 20A shows a cellular phone, which is composed of a main body 2001*a*, an audio output portion 2002*a*, an audio input portion 2003*a*, a display portion 2004*a*, operation switches 2005*a*, and an antenna 2006*a*. By using a light emitting device of the present invention as the display portion 2004*a*, the cellular phone can be thin and light-weight, and consumes less power. Accordingly, battery consumption is reduced, carrying the cellular phone is easy, and the main body is compact.

FIG. 20B shows audio (specifically, car audio), which is composed of a main body 2001*b*, a display portion 2002*b*, and operation switches 2003*b* and 2004*b*. By using a light emitting device of the present invention as the display portion 2002*b*, the audio can be thin and light-weight, and consumes less power. Although car audio is taken as an example in this embodiment, the audio may be home audio.

It is effective to give the electric appliances shown in FIGS. 19A to 20B a function of modulating the luminance of emitted light in accordance with the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the surroundings are dark.

Various electric appliances that employ as light sources the light emitting device of the present invention are also thin and light-weight and can operate consuming less power, which makes them very useful appliances. Light sources of liquid crystal display devices, such as back light or front light, or light sources of lighting fixtures are typical uses of the light emitting device of the present invention as a light source.

When liquid crystal displays are used as the display portions of the electric appliances shown in FIGS. 19A to 20B according to this embodiment, the electric appliances can be thin and light-weight and consume less power if those liquid crystal displays use as back light or front light the light emitting device of the present invention.

A light emitting device having low electric power consumption and superior longevity can be obtained by implementing the present invention. In addition, electronic devices which are bright, have low electric power consumption, and a long life can be obtained by using this type of light emitting device as a light source or as a display portion.

In the preferred embodiments of the present invention, the concentration changing regions are disposed between the hole transportation region and the mixture region and between the electron transportation region and the mixture region, respectively. However, the present invention may include a light emitting device in which only one concentration changing region is disposed between the mixture region and desired one of the hole transportation region and the electron transportation region.

What is claimed is:

1. A light emitting device comprising an organic light emitting element, the organic light element having:

an anode;

a cathode;

an organic compound film containing a hole transporting material and an electron transporting material;

wherein the organic compound film has a structure comprising in a direction from the anode to the cathode:

a hole transporting region comprising the hole transporting material;

a first concentration change region in which the proportion of the electron transporting material increases gradually until a ratio between the hole transporting material and the electron transporting material becomes x:y (where x and y are positive constants);

a mixture region containing the hole transporting material and the electron transporting material at the ratio of x:y;

a second concentration change region in which the proportion of the electron transporting material gradually increases further from the x:y ratio; and an electron transporting region comprising the electron transporting material; and wherein a light emitting region, into which a light emitting material for performing light emission is added, is formed within the mixture region.

2. A light emitting device comprising an organic light emitting element, the organic light element having:
an anode;
a cathode;
a hole injecting region formed contacting the anode;
an organic compound film containing a hole transporting material and an electron transporting material;
wherein
the organic compound film has a structure comprising in a direction from the anode to the cathode:
a hole transporting region comprising the hole transporting material;
a first concentration change region in which the proportion of the electron transporting material increases gradually until a ratio between the hole transporting material and the electron transporting material becomes x:y (where x and y are positive constants);
a mixture region containing the hole transporting material and the electron transporting material at the ratio of x:y;
a second concentration change region in which the proportion of the electron transporting material gradually increases further from the x:y ratio; and
an electron transporting region comprising the electron transporting material;
wherein a light emitting region, into which a light emitting material for performing light emission is added, is formed within the mixture region.

3. A light emitting device comprising an organic light emitting element, the organic light element having:
an anode;
a cathode;
an electron injecting region formed contacting the cathode; and
an organic compound film containing a hole transporting material and an electron transporting material,
wherein
the organic compound film has a structure comprising in a direction from the anode to the cathode:
a hole transporting region comprising the hole transporting material;
a first concentration change region in which the proportion of the electron transporting material increases gradually until a ratio between the hole transporting material and the electron transporting material becomes x:y (where x and y are positive constants);
a mixture region containing the hole transporting material and the electron transporting material at the ratio of x:y;
a second concentration change region in which the proportion of the electron transporting material gradually increases further from the x:y ratio; and
an electron transporting region comprising the electron transporting material; and
wherein a light emitting region, into which a light emitting material for performing light emission is added, is formed within the mixture region.

4. A light emitting device comprising an organic light emitting element, the organic light element comprising:
an anode;
a cathode;
a hole injecting region formed contacting the anode;
an electron injecting region formed contacting the cathode; and
an organic compound film containing a hole transporting material and an electron transporting material;
wherein
the organic compound film has a structure which comprises in a direction from the anode to the cathode:
a hole transporting region comprising the hole transporting material;
a first concentration change region in which the proportion of the electron transporting material increases gradually until a ratio between the hole transporting material and the electron transporting material becomes x:y (where x and y are positive constants);
a mixture region containing the hole transporting material and the electron transporting material at the ratio of x:y;
a second concentration change region in which the proportion of the electron transporting material gradually increases further from the x:y ratio; and
an electron transporting region comprising the electron transporting material, and
wherein a light emitting region, into which a light emitting material for performing light emission is added, is formed within the mixture region.

5. A light emitting device according to any one of claims 1 to 4, wherein the light emitting region, into which the light emitting material is added, is a portion within the mixture region.

6. A light emitting device according to any one of claims 1 to 4, wherein a blocking material, having an energy difference between its highest occupied molecular orbital and its lowest unoccupied molecular orbital which is larger than that of the hole transporting material and the electron transporting material, is added to a portion within the mixture region.

7. A light emitting device according to claim 5, wherein:
a blocking material, having an energy difference between its highest occupied molecular orbital and its lowest unoccupied molecular orbital which is larger than that of the hole transporting material and the electron transporting material, is added to a portion within the mixture region; and
the light emitting region having the light emitting material added thereto is positioned closer to the anode than to the region having the blocking material added thereto.

8. A light emitting device according to any one of claims 1 to 4, wherein the light emitting material performs light emission from a triplet excitation state.

9. A light emitting device according to any one of claims 1 to 4, wherein mass percentage of the hole transporting material within the mixture region is greater than or equal to 10%, and less than or equal to 90%, with respect to total mass of the hole transporting material and the electron transporting material.

10. The light emitting device according to any one of claims 1 to 4, wherein the mixture region has a thickness greater than or equal to 10 nanometers, and less than or equal to 100 nanometers.

11. An electronic device using the light emitting device according to any one of claims 1 to 4.

12. The light emitting device according to any one of claims 1 to 4 wherein the light emitting device is a passive matrix type.

13. The light emitting device according to any one of claims 1 to 4 wherein the light emitting device is an active matrix type.

14. A cellular phone comprising a main body, an audio output portion, an audio input portion, a display portion including a light emitting device, operation switches, and an antenna:

said light emitting device comprising an organic light emitting element, the organic light element having:
an anode;
a cathode;
an organic compound film containing a hole transporting material and an electron transporting material;
wherein the organic compound film has a structure comprising in a direction from the anode to the cathode:
a hole transporting region comprising the hole transporting material;
a first concentration change region in which the proportion of the electron transporting material increases gradually until a ratio between the hole transporting material and the electron transporting material becomes x:y (where x and y are positive constants);
a mixture region containing the hole transporting material and the electron transporting material at the ratio of x:y;
a second concentration change region in which the proportion of the electron transporting material gradually increases further from the x:y ratio; and
an electron transporting region comprising the electron transporting material; and
wherein a light emitting region, into which a light emitting material for performing light emission is added, is formed within the mixture region.

15. A cellular phone according to claim 14, wherein the light emitting region, into which the light emitting material is added, is a portion within the mixture region.

16. A cellular phone according to claim 14, wherein a blocking material, having an energy difference between its highest occupied molecular orbital and its lowest unoccupied molecular orbital which is larger than that of the hole transporting material and the electron transporting material, is added to a portion within the mixture region.

17. A cellular phone according to claim 15, wherein:
a blocking material, having an energy difference between its highest occupied molecular orbital and its lowest unoccupied molecular orbital which is larger than that of the hole transporting material and the electron transporting material, is added to a portion within the mixture region; and
the light emitting region having the light emitting material added thereto is positioned closer to the anode than to the region having the blocking material added thereto.

18. A cellular phone according to claim 14, wherein the light emitting material performs light emission from a triplet excitation state.

19. A cellular phone according to claim 14, wherein mass percentage of the hole transporting material within the mixture region is greater than or equal to 10%, and less than or equal to 90%, with respect to total mass of the hole transporting material and the electron transporting material.

20. A cellular phone according to claim 14, wherein the mixture region has a thickness greater than or equal to 10 nanometers, and less than or equal to 100 nanometers.

21. A cellular phone device according to claim 14, wherein the light emitting device is a passive matrix type.

22. A cellular phone according to claim 14, wherein the light emitting device is an active matrix type.

23. An audio comprising a main body, a display portion including a light emitting device, operation switches, and an antenna:

said light emitting device comprising an organic light emitting element, the organic light element having:
an anode;
a cathode;
an organic compound film containing a hole transporting material and an electron transporting material;
wherein the organic compound film has a structure comprising in a direction from the anode to the cathode:
a hole transporting region comprising the hole transporting material;
a first concentration change region in which the proportion of the electron transporting material increases gradually until a ratio between the hole transporting material and the electron transporting material becomes x:y (where x and y are positive constants);
a mixture region containing the hole transporting material and the electron transporting material at the ratio of x:y;
a second concentration change region in which the proportion of the electron transporting material gradually increases further from the x:y ratio; and
an electron transporting region comprising the electron transporting material; and
wherein a light emitting region, into which a light emitting material for performing light emission is added, is formed within the mixture region.

24. An audio according to claim 23, wherein the light emitting region, into which the light emitting material is added, is a portion within the mixture region.

25. An audio according to claim 23, wherein a blocking material, having an energy difference between its highest occupied molecular orbital and its lowest unoccupied molecular orbital which is larger than that of the hole transporting material and the electron transporting material, is added to a portion within the mixture region.

26. An audio according to claim 24, wherein:
a blocking material, having an energy difference between its highest occupied molecular orbital and its lowest unoccupied molecular orbital which is larger than that of the hole transporting material and the electron transporting material, is added to a portion within the mixture region; and
the light emitting region having the light emitting material added thereto is positioned closer to the anode than to the region having the blocking material added thereto.

27. An audio according to claim 23, wherein the light emitting material performs light emission from a triplet excitation state.

28. An audio according to claim 23, wherein mass percentage of the hole transporting material within the mixture region is greater than or equal to 10%, and less than or equal to 90%, with respect to total mass of the hole transporting material and the electron transporting material.

29. An audio according to claim 23, wherein the mixture region has a thickness greater than or equal to 10 nanometers, and less than or equal to 100 nanometers.

30. An audio according to claim 23, wherein the light emitting device is a passive matrix type.

31. An audio according to claim 23, wherein the light emitting device is an active matrix type.

* * * * *